United States Patent
Aoyagi

(10) Patent No.: US 11,139,248 B2
(45) Date of Patent: Oct. 5, 2021

(54) MOUNTING SUBSTRATE AND ELECTRONIC APPARATUS

(71) Applicant: Sony Corporation, Tokyo (JP)

(72) Inventor: Akiyoshi Aoyagi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 320 days.

(21) Appl. No.: 15/128,443

(22) PCT Filed: Mar. 17, 2015

(86) PCT No.: PCT/JP2015/057847
§ 371 (c)(1),
(2) Date: Sep. 23, 2016

(87) PCT Pub. No.: WO2015/151796
PCT Pub. Date: Oct. 8, 2015

(65) Prior Publication Data
US 2018/0174973 A1   Jun. 21, 2018

(30) Foreign Application Priority Data

Mar. 31, 2014 (JP) .............................. JP2014-074844

(51) Int. Cl.
*H01L 23/34* (2006.01)
*H01L 23/538* (2006.01)
(Continued)

(52) U.S. Cl.
CPC ........ *H01L 23/5386* (2013.01); *H01L 21/486* (2013.01); *H01L 21/4853* (2013.01);
(Continued)

(58) Field of Classification Search
CPC ............. H01L 21/4853; H01L 21/4857; H01L 21/486; H01L 23/5383; H01L 23/5384;
(Continued)

(56) References Cited

U.S. PATENT DOCUMENTS

| 5,812,105 A | 9/1998 | Van de Ven |
| 6,184,853 B1 | 2/2001 | Hebiguchi et al. |

(Continued)

FOREIGN PATENT DOCUMENTS

| EP | 0 989 539 A1 | 3/2000 |
| EP | 2 680 326 A2 | 1/2014 |

(Continued)

OTHER PUBLICATIONS

International Search Report and English translation thereof dated Jun. 2, 2015 in connection with International Application No. PCT/JP2015/057847.

(Continued)

*Primary Examiner* — Meiya Li
(74) *Attorney, Agent, or Firm* — Wolf, Greenfield & Sacks, P.C.

(57) ABSTRACT

A mounting substrate according to an embodiment of the present technology includes: a wiring substrate (30); a fine L/S layer (40) formed in contact with a top surface of the wiring substrate; and a plurality of elements (12, 13) arranged in a matrix on a top surface of the fine L/S layer. The wiring substrate includes a plurality of first wiring lines (SigB1, Gate2), and a plurality of vias (14) arranged at a period corresponding to an integral multiple of an arrangement period of the plurality of element, and two or more of the vias are provided for each of the first wiring lines. Two or more adjacent ones of the elements on the fine L/S layer are electrically coupled to common one of the vias through one or more second wiring lines (16).

8 Claims, 15 Drawing Sheets

(51) Int. Cl.
  *H01L 25/16* (2006.01)
  *H01L 21/48* (2006.01)
  *H01L 31/02* (2006.01)
  *H01L 33/62* (2010.01)
  *H05K 3/46* (2006.01)
  *H05K 1/18* (2006.01)

(52) U.S. Cl.
  CPC ...... *H01L 21/4857* (2013.01); *H01L 23/5383* (2013.01); *H01L 23/5384* (2013.01); *H01L 25/167* (2013.01); *H01L 31/02005* (2013.01); *H01L 33/62* (2013.01); *H01L 2924/0002* (2013.01); *H05K 1/185* (2013.01); *H05K 3/4602* (2013.01); *H05K 2201/10106* (2013.01); *H05K 2201/10128* (2013.01)

(58) Field of Classification Search
  CPC ... H01L 23/5386; H01L 25/167; H01L 31/02; H01L 2924/0002; H01L 2924/00; H01L 31/02005; H01L 33/62
  See application file for complete search history.

(56) References Cited

U.S. PATENT DOCUMENTS

| | | | |
|---|---|---|---|
| 6,501,441 | B1 | 12/2002 | Ludtke et al. |
| 7,250,978 | B2 | 7/2007 | Lee et al. |
| 10,510,286 | B2 | 12/2019 | Aoyagi et al. |
| 2004/0032220 | A1 | 2/2004 | Cok et al. |
| 2005/0017268 | A1 | 1/2005 | Tsukamoto et al. |
| 2005/0057641 | A1* | 3/2005 | Ogihara ............ B41J 2/45 347/238 |
| 2006/0061535 | A1 | 3/2006 | Kim et al. |
| 2006/0158393 | A1 | 7/2006 | Fukumoto et al. |
| 2006/0263003 | A1* | 11/2006 | Asai ............ G02B 6/4204 385/14 |
| 2008/0129363 | A1 | 6/2008 | Usui |
| 2008/0174515 | A1 | 7/2008 | Matthies et al. |
| 2008/0211760 | A1 | 9/2008 | Baek et al. |
| 2008/0308797 | A1 | 12/2008 | Akimoto et al. |
| 2009/0033644 | A1 | 2/2009 | Kawaguchi et al. |
| 2009/0179891 | A1 | 7/2009 | Kim |
| 2010/0156771 | A1 | 6/2010 | Lee et al. |
| 2010/0177089 | A1 | 7/2010 | Huang |
| 2010/0207851 | A1 | 8/2010 | Cok et al. |
| 2010/0253677 | A1 | 10/2010 | Kroll et al. |
| 2011/0057861 | A1 | 3/2011 | Cok et al. |
| 2011/0102309 | A1 | 5/2011 | Cho |
| 2012/0237159 | A1 | 9/2012 | Tsujita et al. |
| 2012/0256814 | A1* | 10/2012 | Ootorii ............ G09G 3/3208 345/82 |
| 2013/0009938 | A1 | 1/2013 | Hwang et al. |
| 2013/0049033 | A1 | 2/2013 | Nei |
| 2013/0228905 | A1 | 9/2013 | von Koblinski et al. |
| 2014/0001502 | A1 | 1/2014 | Akimoto et al. |
| 2014/0117314 | A1 | 5/2014 | Jeong et al. |
| 2014/0159798 | A1 | 6/2014 | Duan |
| 2014/0168037 | A1 | 6/2014 | Sakariya et al. |
| 2015/0131017 | A1 | 5/2015 | Ro et al. |
| 2015/0161930 | A1 | 6/2015 | Kim et al. |
| 2015/0169011 | A1 | 6/2015 | Bibl et al. |
| 2015/0243220 | A1 | 8/2015 | Kim et al. |
| 2015/0277180 | A1 | 10/2015 | Seo et al. |
| 2016/0267836 | A1 | 9/2016 | Meersman et al. |
| 2017/0103926 | A1 | 4/2017 | Aoyagi et al. |
| 2018/0218668 | A1 | 8/2018 | Aoyagi et al. |

FOREIGN PATENT DOCUMENTS

| | | |
|---|---|---|
| JP | 2001-215528 A | 8/2001 |
| JP | 2003-115613 A | 4/2003 |
| JP | 2005-033141 A | 2/2005 |
| JP | 2006-179942 A | 7/2006 |
| JP | 2006-251534 A | 9/2006 |
| JP | 2007-188079 A | 7/2007 |
| JP | 2009-037164 A | 2/2009 |
| JP | 2010-015163 A | 1/2010 |
| JP | 2010-238323 A | 10/2010 |
| JP | 2012-042567 A | 3/2012 |
| JP | 2012-142376 A | 7/2012 |
| JP | 2012-518208 A | 8/2012 |
| JP | 2012-227514 A | 11/2012 |
| JP | 2014-011275 A | 1/2014 |
| WO | WO 97/24706 A2 | 7/1997 |
| WO | WO 99/41788 A1 | 8/1999 |
| WO | WO 2010/096341 A1 | 8/2010 |
| WO | WO 2013/105347 A1 | 7/2013 |

OTHER PUBLICATIONS

International Search Report and English translation thereof dated Jun. 2, 2015 in connection with International Application No. PCT/JP2015/057848.

Written Opinion International with English translation thereof dated Jun. 2, 2015 in connection with Application No. PCT/JP2015/057847.

Written Opinion International with English translation thereof dated Jun. 2, 2015 in connection with Application No. PCT/JP2015/057848.

International Search Report and English translation thereof dated Jun. 16, 2015 in connection with International Application No. PCT/JP2015/057849.

Written Opinion International with English translation thereof dated Jun. 16, 2015 in connection with Application No. PCT/JP2015/057849.

International Preliminary Report on Patentability and English translation thereof dated Oct. 13, 2016 in connection with International Application No. PCT/JP2015/057847.

International Preliminary Report on Patentability and English translation thereof dated Oct. 13, 2016 in connection with International Application No. PCT/JP2015/057848.

International Preliminary Report on Patentability and English translation thereof dated Oct. 13, 2016 in connection with International Application No. PCT/JP2015/057849.

* cited by examiner

[ FIG. 1 ]
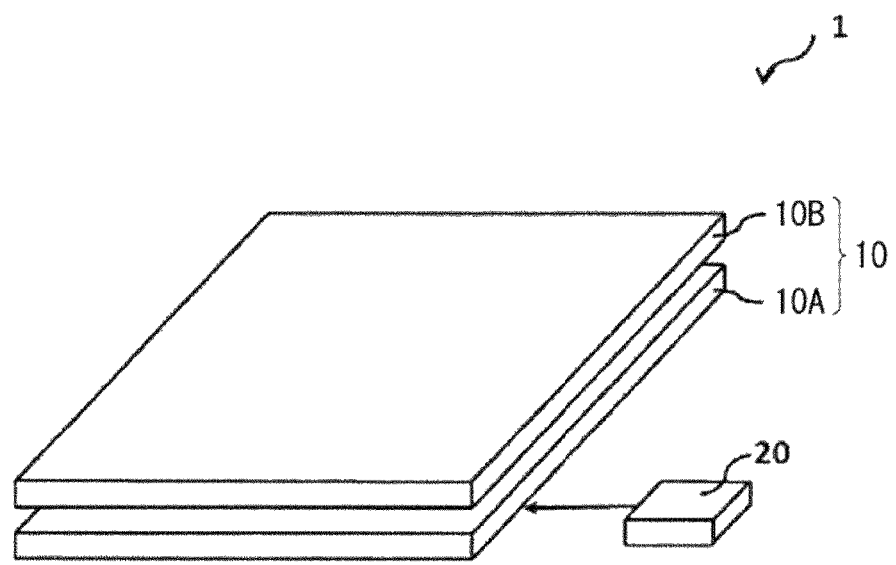

[ FIG. 2 ]
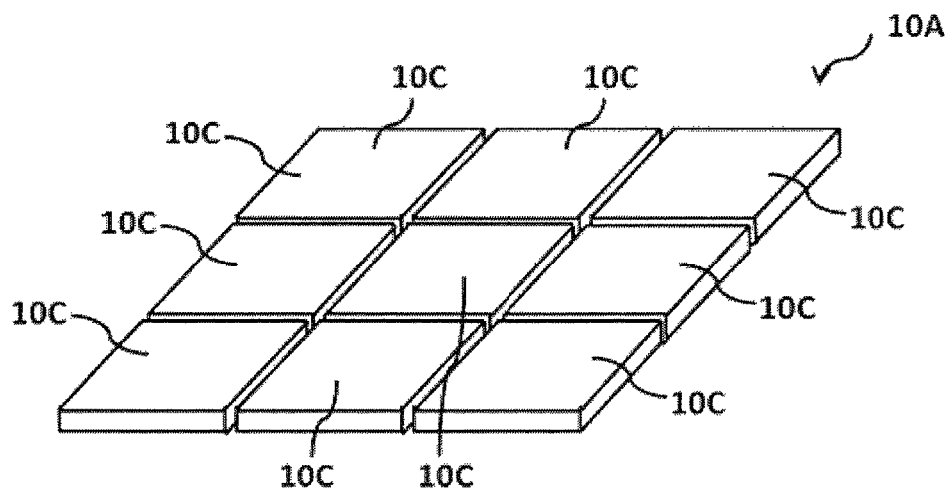
[ FIG. 3 ]
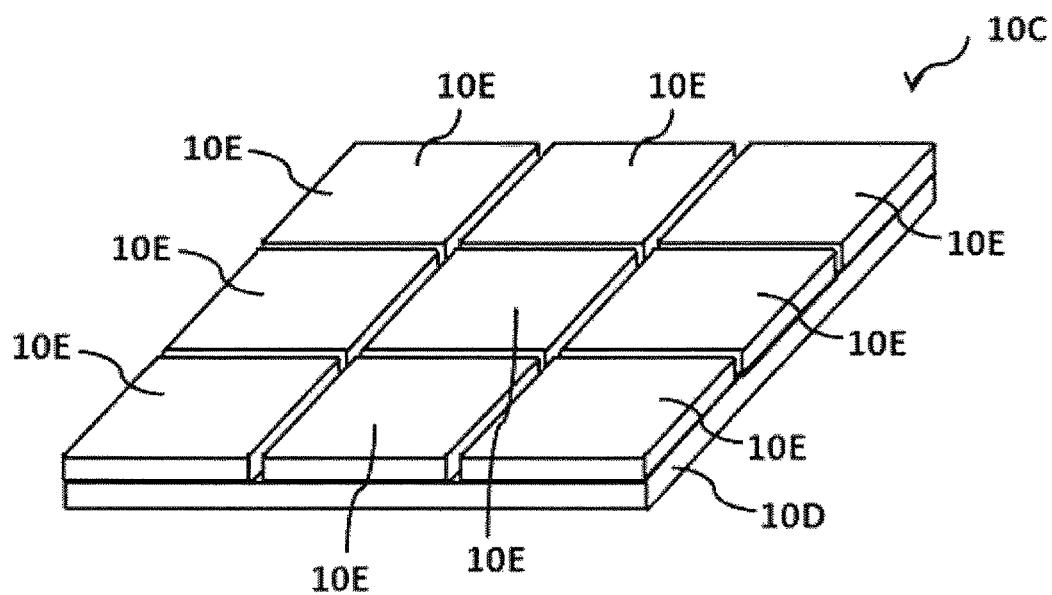

[ FIG. 4 ]
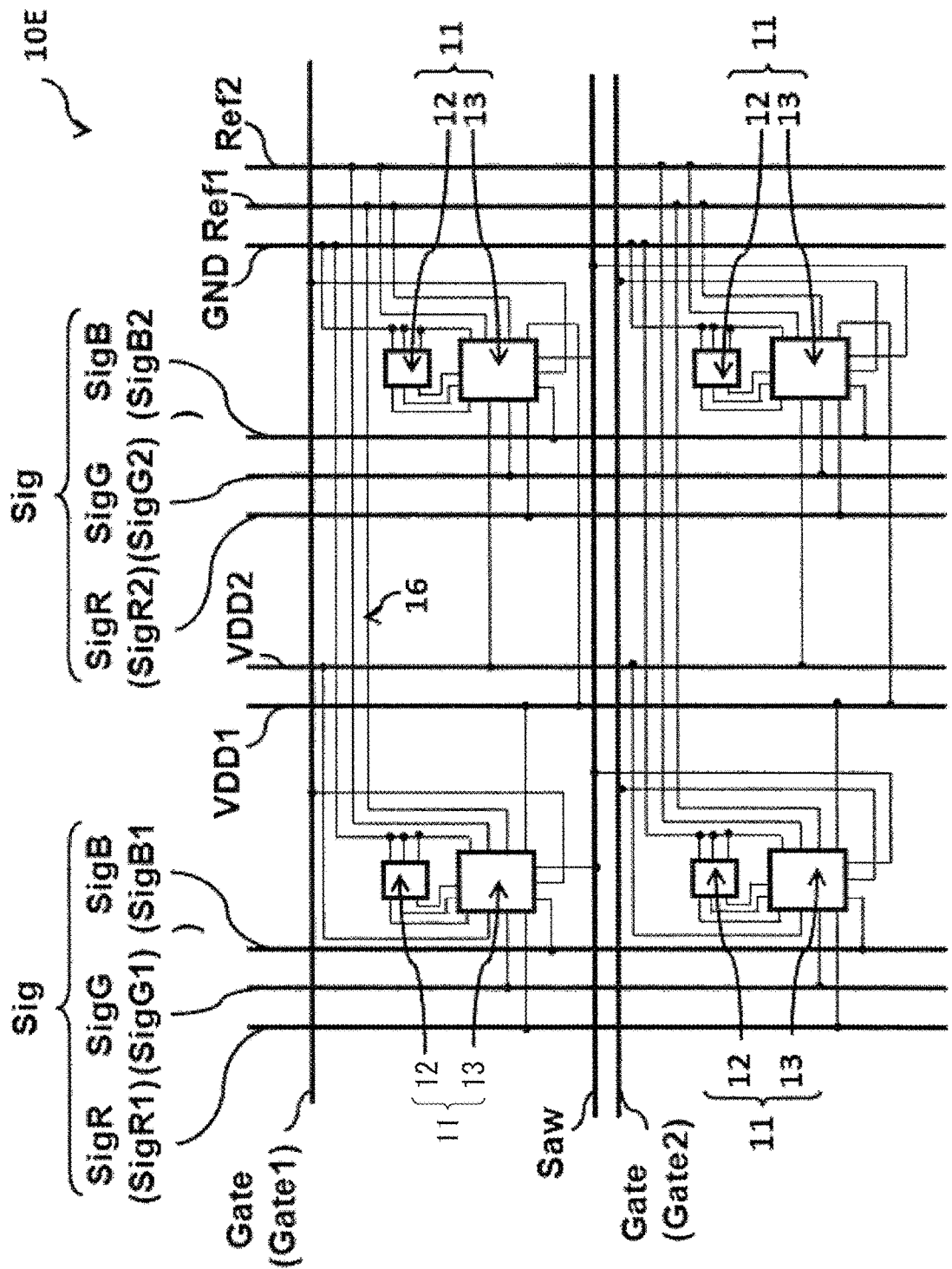

[ FIG. 5 ]
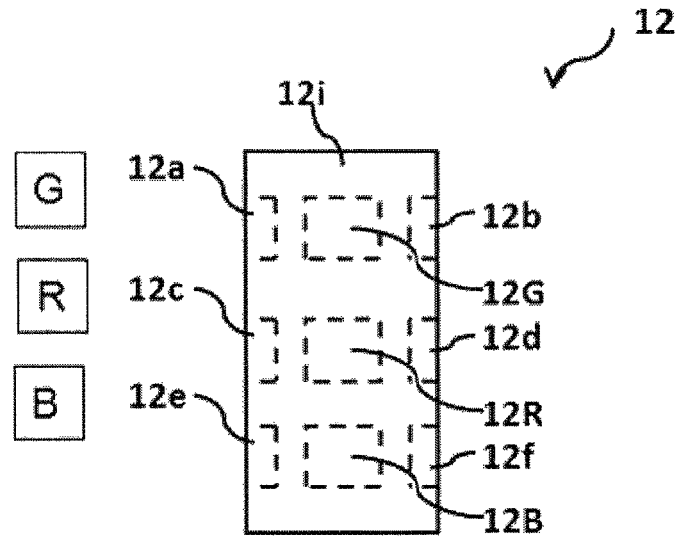
[ FIG. 6 ]
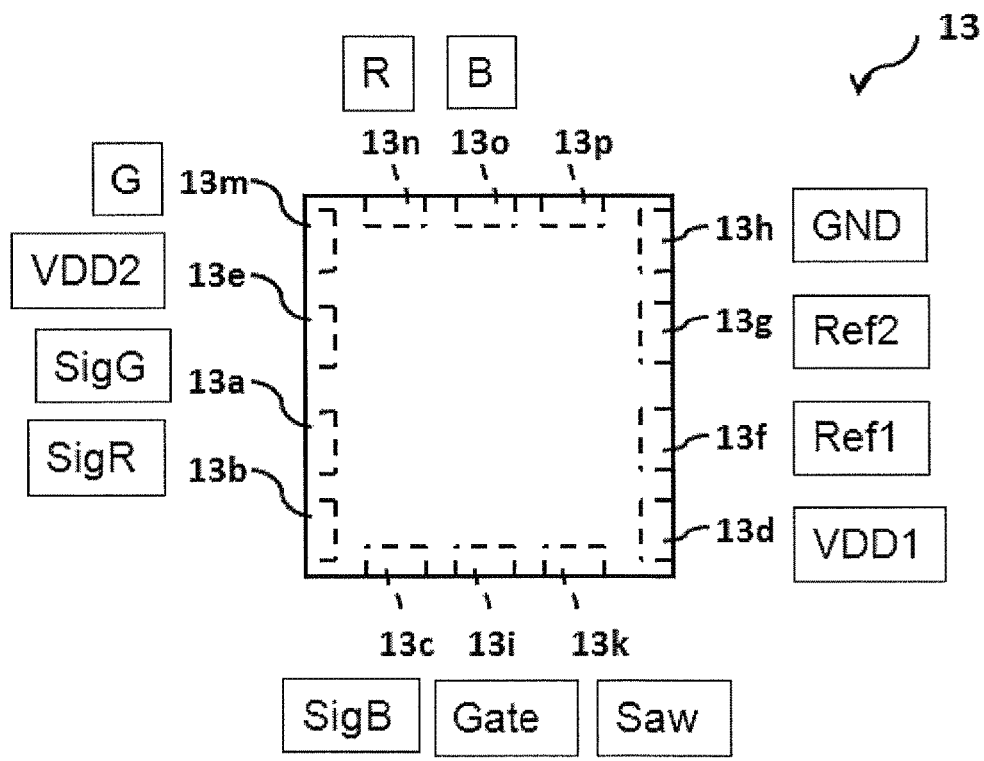

[FIG. 7]
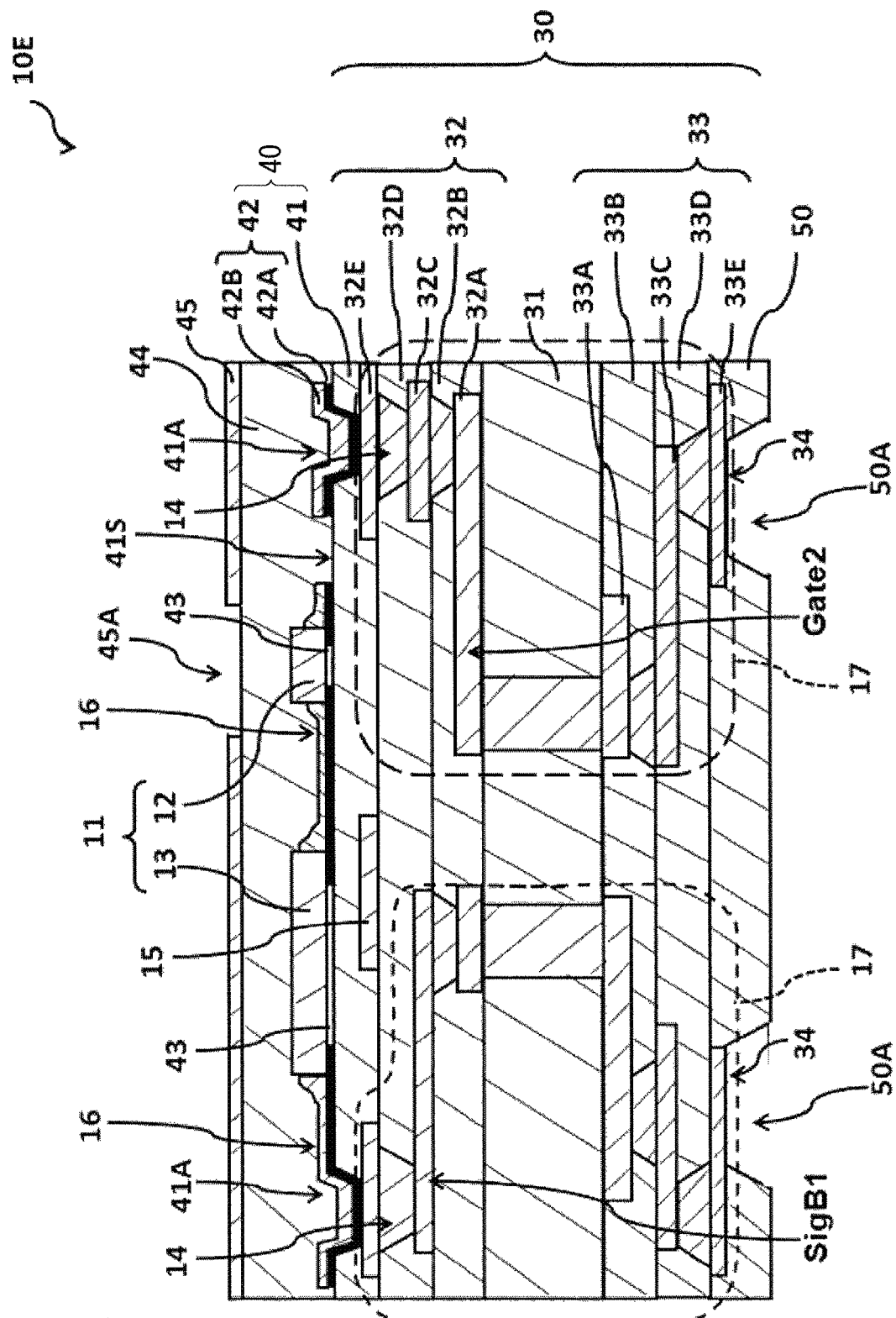

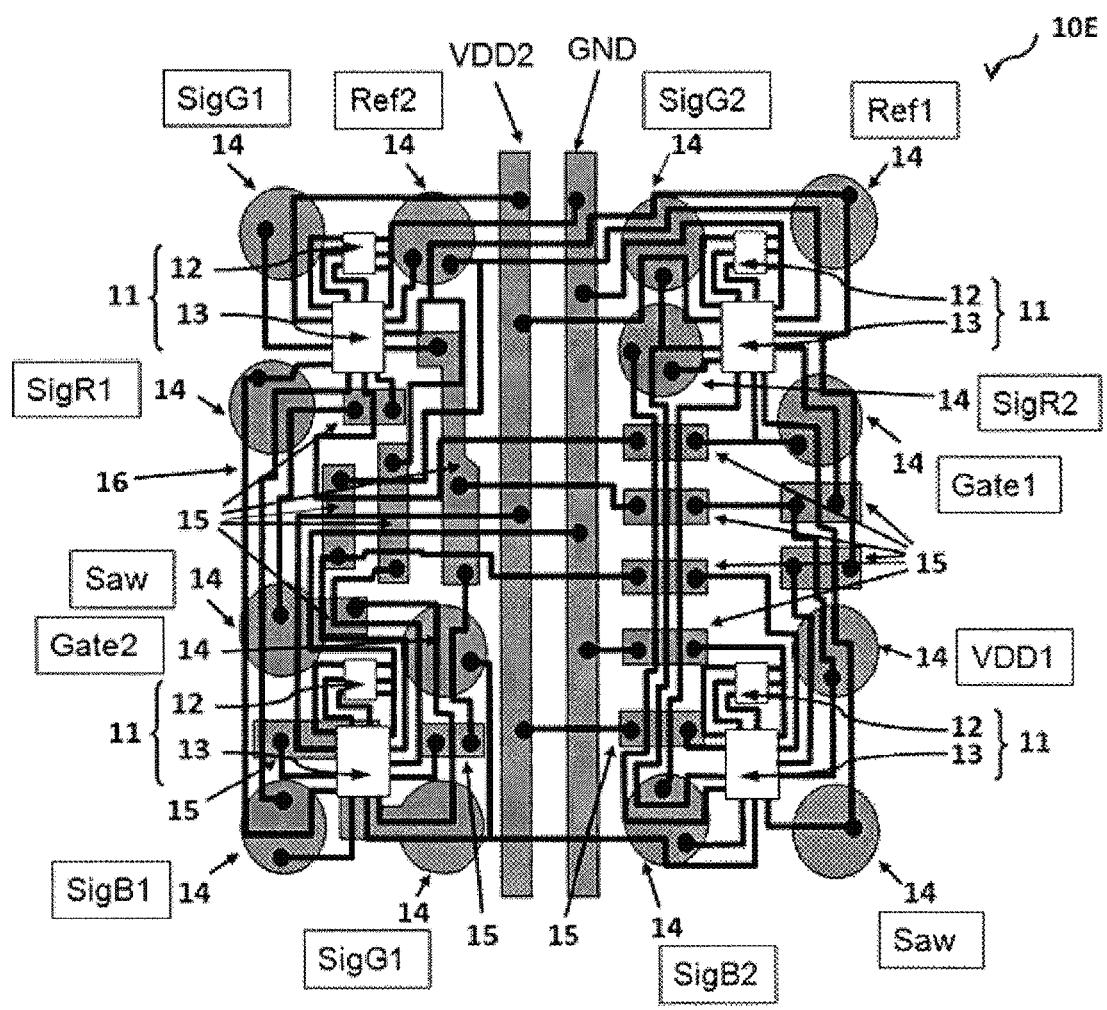
[FIG. 8]

[FIG. 9]
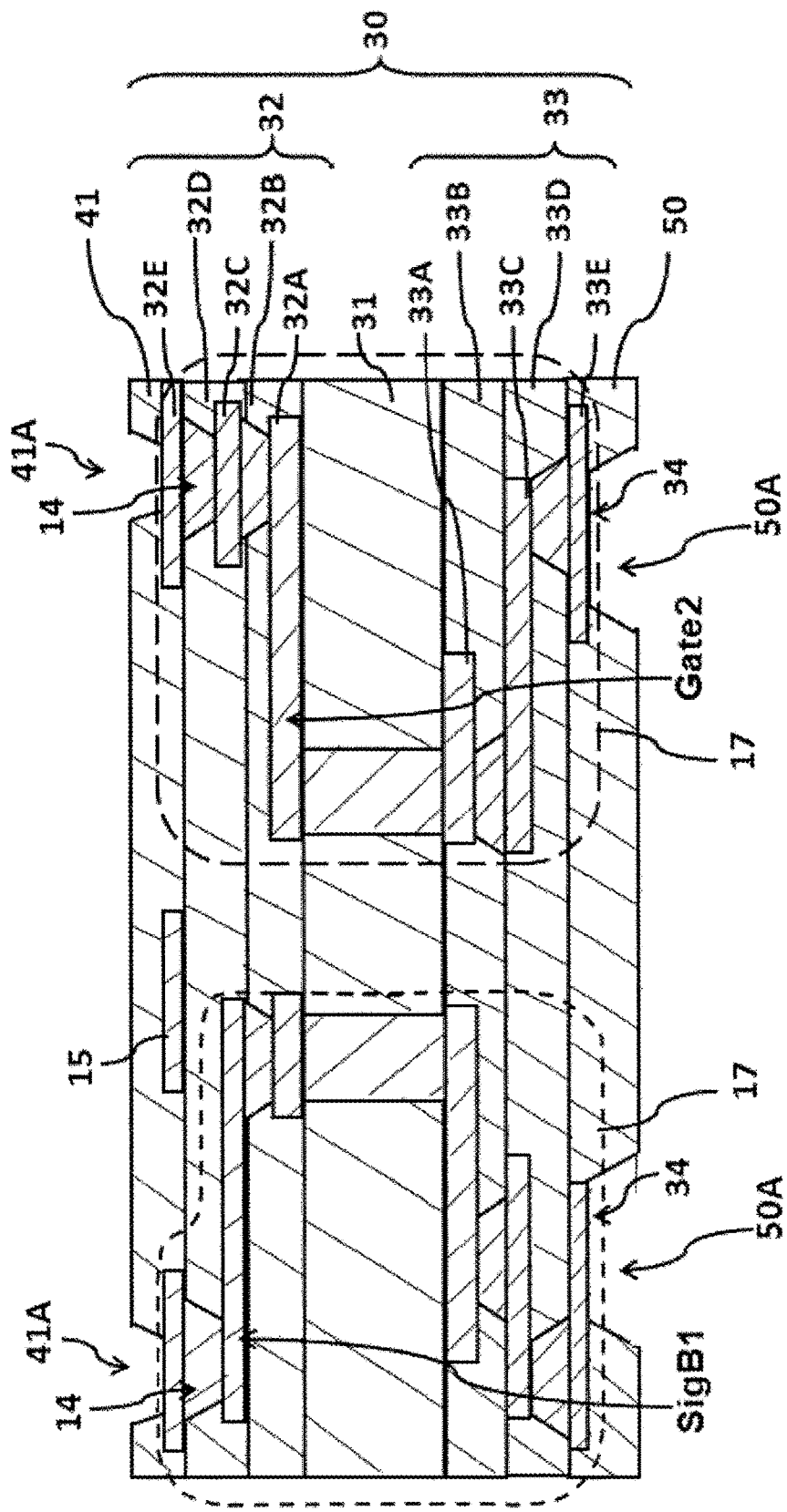

[ FIG. 10 ]
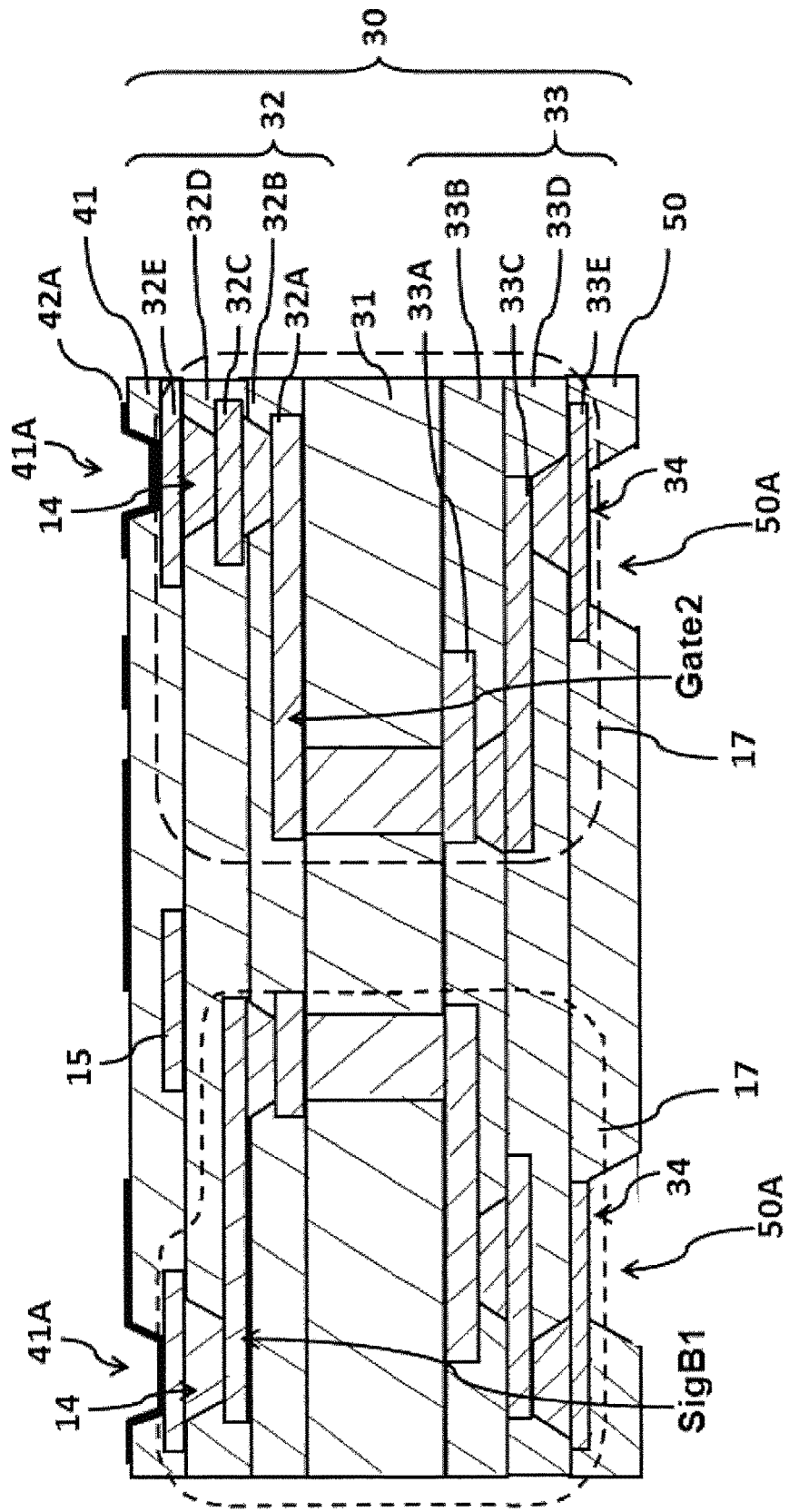

[ FIG. 11 ]
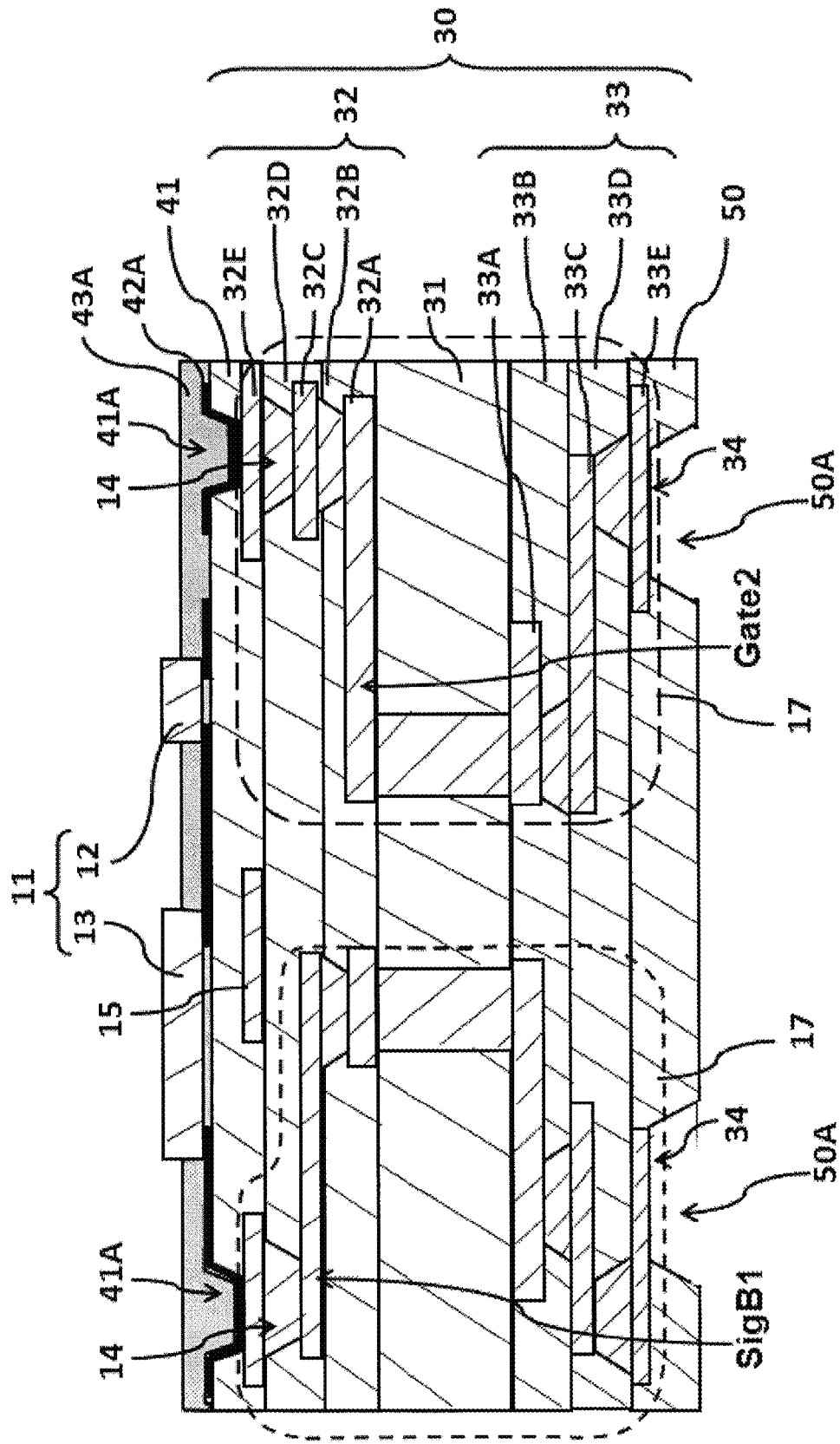

[FIG. 12]
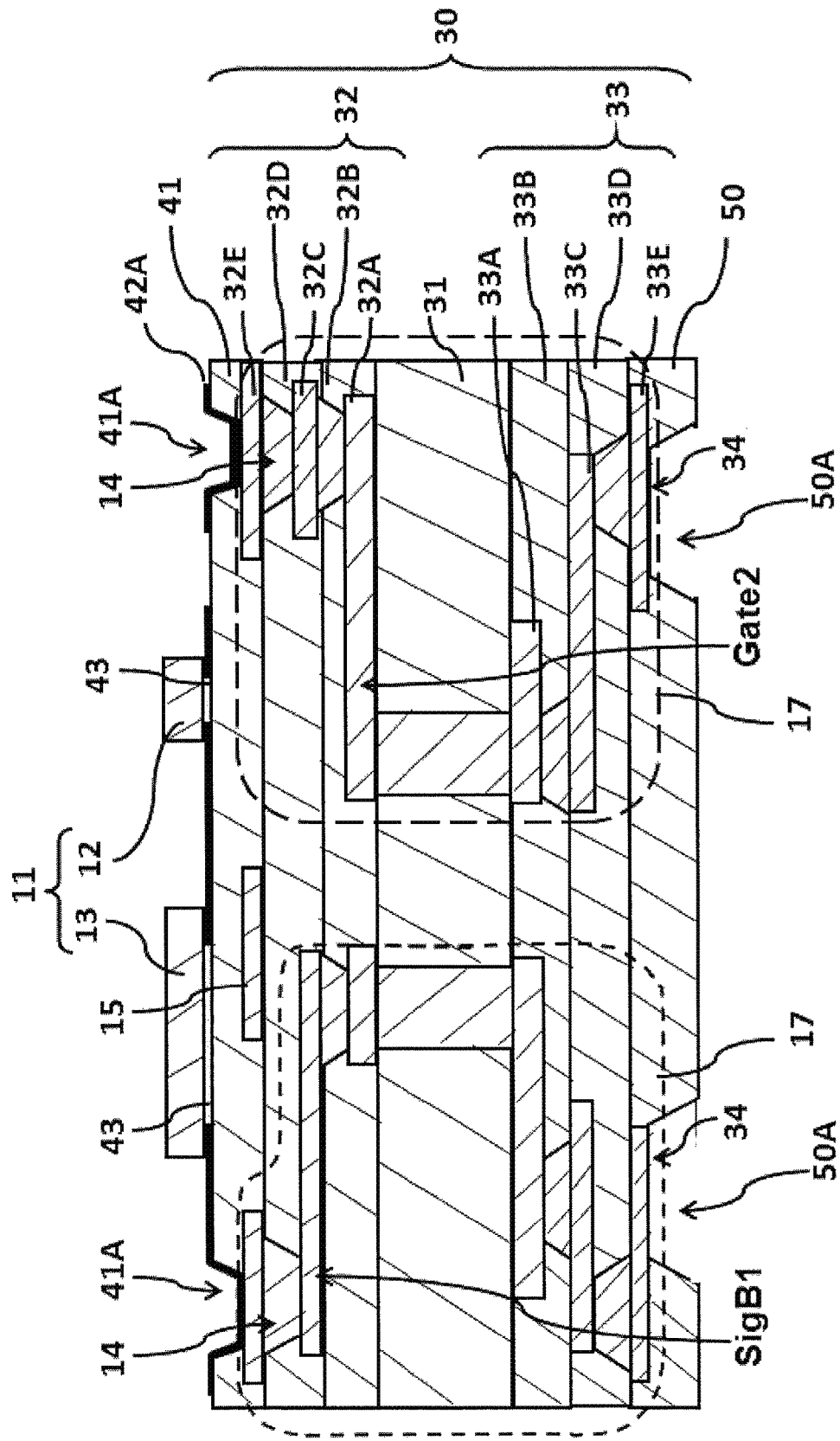

[FIG. 13]
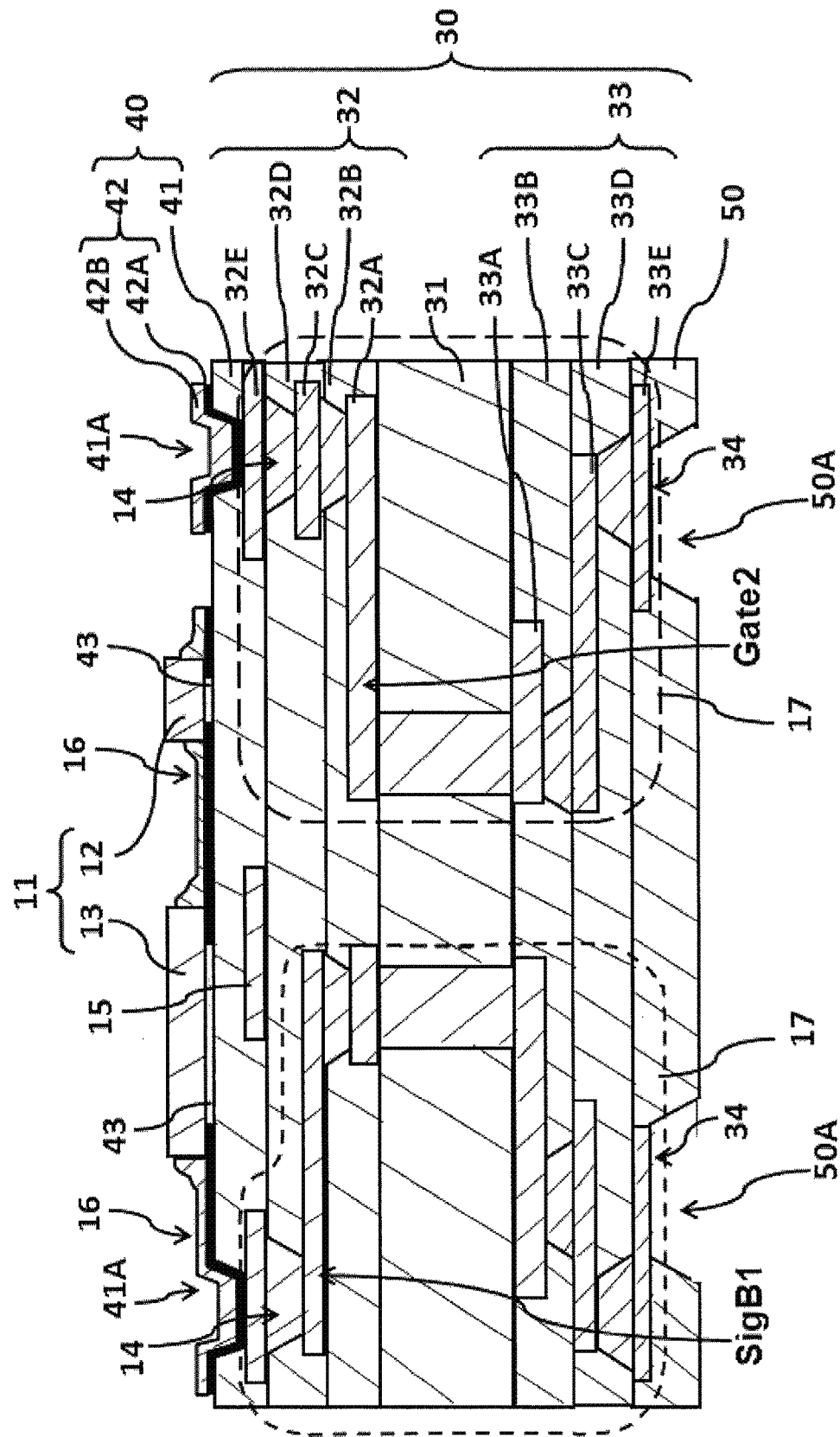

[FIG. 14]
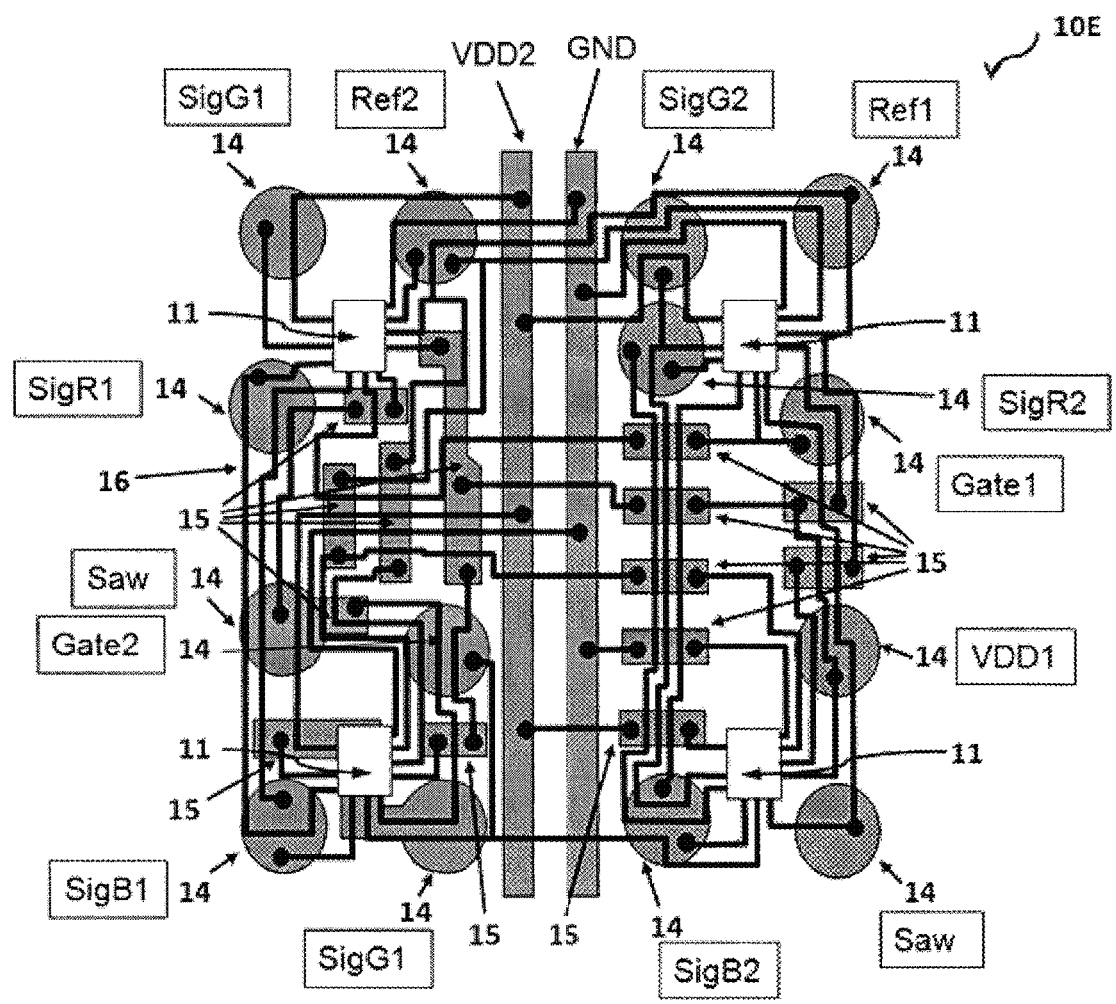

[ FIG. 15 ]
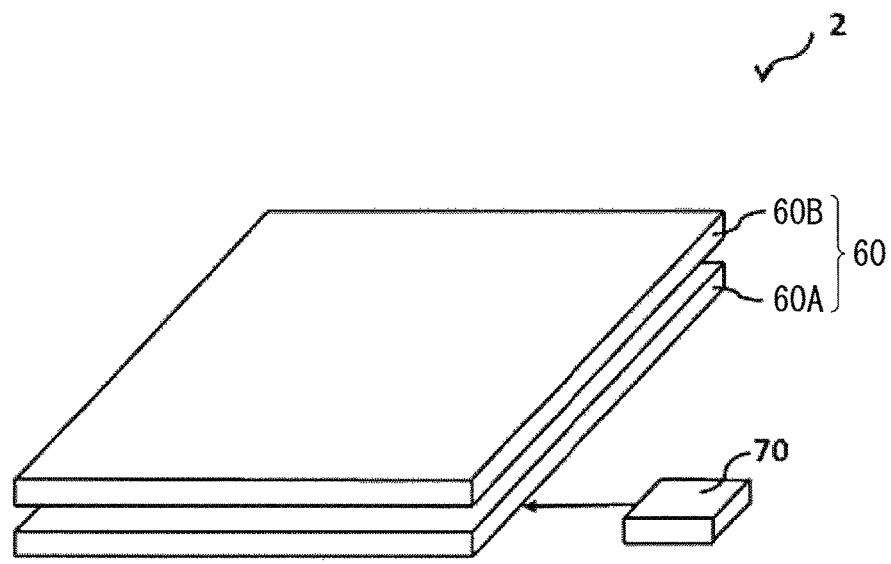
[ FIG. 16 ]
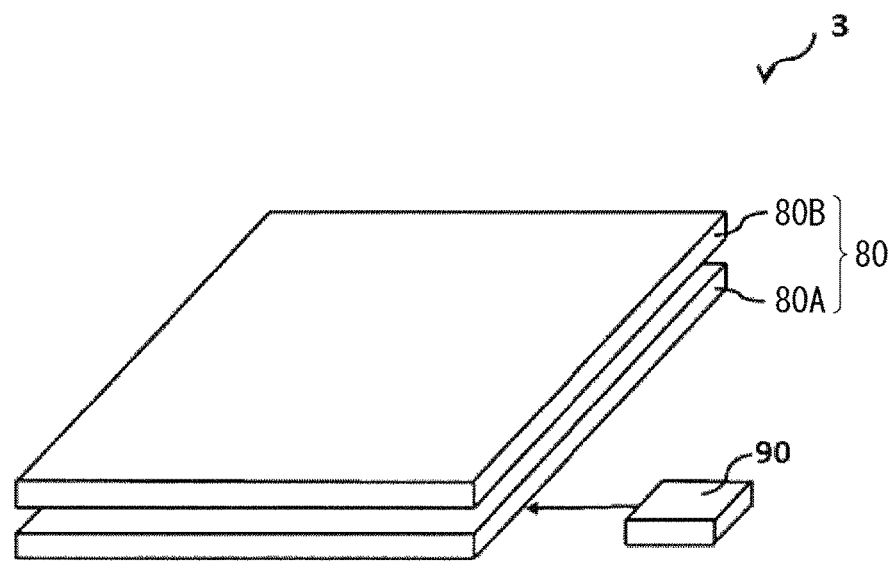

[ FIG. 17 ]
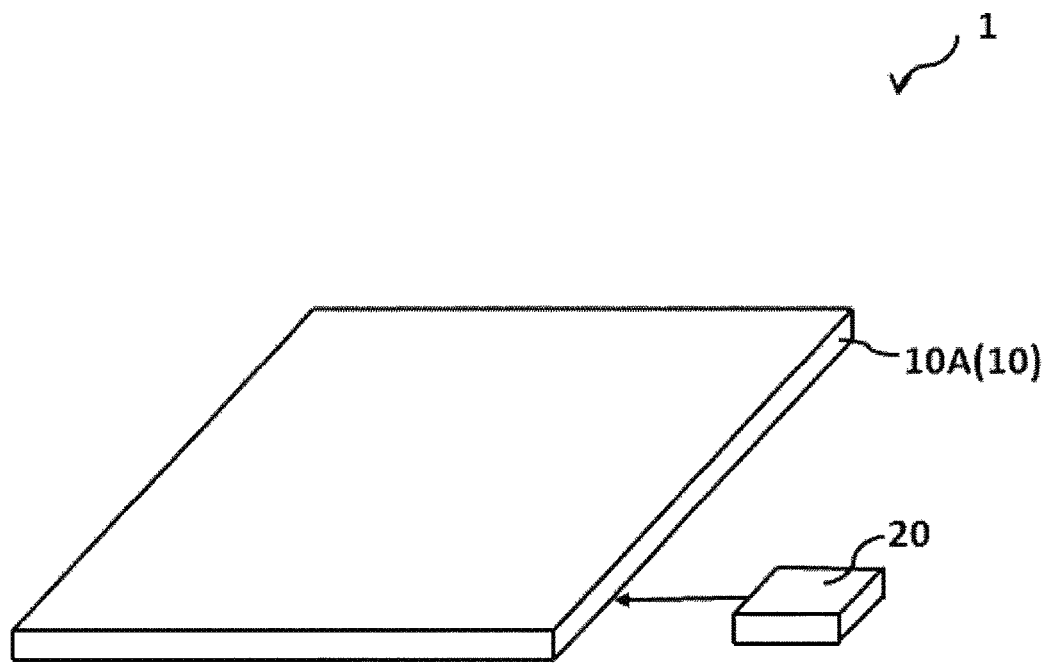
[ FIG. 18 ]
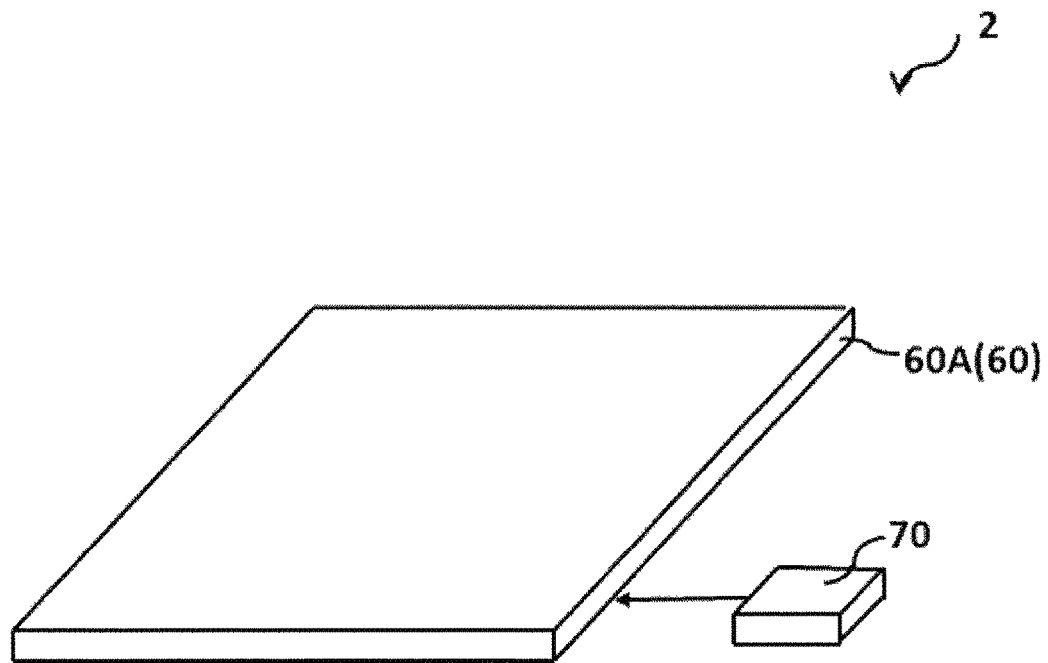

[ FIG. 19 ]
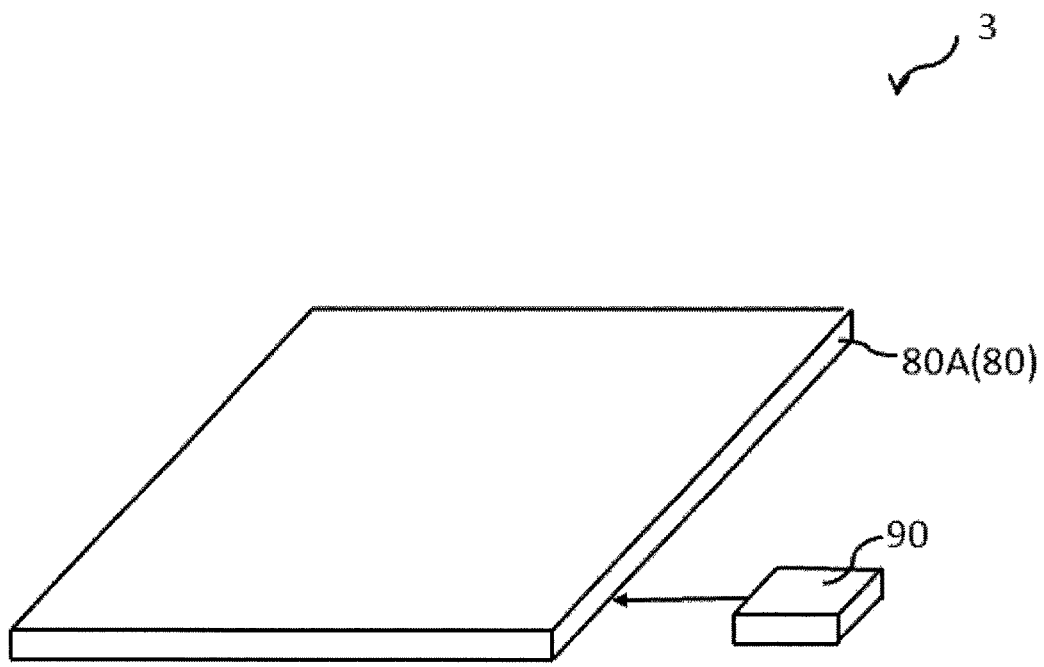

MOUNTING SUBSTRATE AND ELECTRONIC APPARATUS

CROSS-REFERENCE TO RELATED APPLICATIONS

This application is a National Stage of International Application No, PCT/JP2015/057847, filed in the Japanese Patent Office as a Receiving office on Mar. 17, 2015, which claims priority to Japanese Patent Application Number 2014-074844, filed in the Japanese Patent Office on Mar. 31, 2014, each of which is hereby incorporated by reference in its entirety.

TECHNICAL FIELD

The present technology relates to a mounting substrate in which a wiring pitch of a wiring substrate and a wiring pitch of a wiring layer on the wiring substrate are different, and an electronic apparatus with the mounting substrate.

BACKGROUND ART

Patent Literature 1 discloses a display unit in which each LED (Light Emitting Diode) provided at a point of intersection of a signal line and a scanning line is driven by turning on/off signal lines and scanning lines arranged in a grid. In this driving method, since image display is performed by sequential scanning of the scanning lines, it is not easy to increase display luminance. Therefore, for example, as discussed in Patent Literature 2, it may be conceivable to provide an LED and a drive IC for each pixel and to perform active driving of each LED.

CITATION LIST

Patent Literature

Patent Literature 1: Japanese Unexamined Patent Application Publication No. 2009-037164
Patent Literature 2: Japanese Unexamined Patent Application Publication No. 2003-115613

SUMMARY

In the method discussed in Patent Literature 2, it is necessary to provide many wiring lines to be coupled to the drive IC, on a surface (a mounting surface) of a wiring layer on a wiring substrate, and therefore, a wiring pitch of a mounting surface is narrowed. However, since the wiring substrate is a multilayer substrate utilizing via-bonding, it is not easy to narrow a wiring pitch of the wiring substrate in accordance with the wiring pitch of the mounting surface, from a technical aspect or cost aspect. Therefore, for example, it may be conceivable to make the wiring layer multilayered and to provide a layer of a wiring pitch adopting a mean value between the wiring pitch of the mounting surface and the wiring pitch of the wiring substrate. In this case, however, the cost increases by an amount incurred by making the wiring layer multilayered.

It is to be noted that such an issue may occur not only in the field of display unit, but also in a field in which a wiring pitch of a wiring substrate and a wiring pitch of a wiring layer on the wiring substrate are different.

It is therefore desirable to provide a mounting substrate that makes it possible to narrow a wiring pitch of a mounting surface without making a wiring layer on a wiring substrate multilayered, and to provide an electronic apparatus with the mounting substrate.

A mounting substrate according to an embodiment of the present technology includes: a wiring substrate; a fine L/S (line and space) layer formed in contact with a top surface of the wiring substrate; and a plurality of elements arranged in a matrix on a top surface of the fine L/S layer. The wiring substrate includes a plurality of first wiring lines extending in a predetermined direction in a layer, and a plurality of vias. The plurality of vias are arranged at a period corresponding to an integral multiple of an arrangement period of the plurality of element, and two or more of the vias are provided for each of the first wiring lines. The fine L/S layer includes a plurality of second wiring lines and an insulating layer. One or more of the second wiring lines are provided for each of the vias. The insulating layer is provided between each of the second wiring lines and the top surface of the wiring substrate, and is in contact with each of the second wiring lines and the top surface of the wiring substrate. An L/S of the fine L/S layer is smaller than an L/S of the plurality of first wiring lines. Two or more adjacent ones of the elements are electrically coupled to common one of the vias through one or more of the second wiring lines. The L/S indicates the narrowest wiring pitch in a plane.

An electronic apparatus according to an embodiment of the present technology includes: one or a plurality of mounting substrates mentioned above; and a control circuit that controls the one or plurality of mounting substrates.

In the mounting substrate and the electronic apparatus according to the embodiments of the present technology, in the wiring substrate, two or more of the vias are provided for each of the first wiring lines extending in the predetermined direction in the layer, and the two or more vias provided for each of the first wiring lines are arranged at a period corresponding to an integral multiple of the arrangement period of the plurality of elements. Further, two or more adjacent ones of the elements are electrically coupled to common one of the vias through one or more of the second wiring lines in the fine L/S layer. Sharing the via by two or more adjacent elements decreases the number of the vias necessary for each of the elements, as compared with a case in which the via is provided for each of the elements. As a result, the number of wiring layers on the wiring substrate is allowed to be one, when the L/S of the fine L/S layer on the wiring substrate is smaller than the L/S of the plurality of first wiring lines in the wiring substrate.

According to the mounting substrate and the electronic apparatus of the embodiments of the present technology, sharing the via by two or more adjacent elements decreases the number of the vias necessary for each of the elements, as compared with a case in which the via is provided for each of the elements. Therefore, it is possible to reduce a wiring pitch of a mounting surface, without making the wiring layer on the wiring substrate multilayered.

BRIEF DESCRIPTION OF DRAWINGS

FIG. 1 is a diagram illustrating an example of a perspective configuration of a display unit according to a first embodiment of the present technology.

FIG. 2 is a diagram illustrating an example of a perspective configuration of a mounting substrate in FIG. 1.

FIG. 3 is a diagram illustrating an example of a perspective configuration of a unit substrate in FIG. 2.

FIG. 4 is a diagram illustrating an example of a circuit configuration of a cell in FIG. 3.

FIG. 5 is a diagram illustrating an example of a planar configuration of a light-emitting element in FIG. 4.

FIG. 6 is a diagram illustrating an example of a planar configuration of a drive IC in FIG. 4.

FIG. 7 is a diagram illustrating an example of a cross-sectional configuration of the cell in FIG. 3.

FIG. 8 is a diagram illustrating an example of a wiring layout of the cell in FIG. 3.

FIG. 9 is a diagram illustrating an example of a method of manufacturing the cell in FIG. 7.

FIG. 10 is a diagram illustrating an example of a process following a process in FIG. 9.

FIG. 11 is a diagram illustrating an example of a process following the process in FIG. 10.

FIG. 12 is a diagram illustrating an example of a process following the process in FIG. 11.

FIG. 13 is a diagram illustrating an example of a process following the process in FIG. 12.

FIG. 14 is a diagram illustrating a modification example of the wiring layout of the cell in FIG. 3.

FIG. 15 is a diagram illustrating an example of a perspective configuration of an illumination unit according to a second embodiment of the present technology.

FIG. 16 is a diagram illustrating an example of a perspective configuration of a light receiver according to a third embodiment of the present technology.

FIG. 17 is a diagram illustrating a modification example of the perspective configuration of the display unit in FIG. 1.

FIG. 18 is a diagram illustrating a modification example of the perspective configuration of the illumination unit in FIG. 15.

FIG. 19 is a diagram illustrating a modification example of the perspective configuration of the light receiver in FIG. 16.

EMBODIMENTS

Embodiments of the present technology will be described below in detail with reference to the drawings. It is to be noted that the description will be provided in the following order.
1. First Embodiment (Display Unit)
2. Modification Examples (Display Unit)
3. Second Embodiment (Illumination Unit)
4. Modification Example (Illumination Unit)
5. Third Embodiment (Light Receiver)
6. Modification Examples Common to Respective Embodiments 1. First Embodiment

[Configuration]

FIG. 1 illustrates an example of a perspective configuration of a display unit 1 according to a first embodiment of the present technology. The display unit 1 is a so-called LED display, and an LED is used as a display pixel. The display unit 1 may include, for example, a display panel 10, and a control circuit 20 that controls the display panel 10 (specifically, a cell 10E to be described later), as illustrated in FIG. 1.

(Display Panel 10)

The display panel 10 is a panel configured by stacking a mounting substrate 10A and a counter substrate 10B. A surface of the counter substrate 10B serves as an image display surface, and has a display region in its central portion, and a frame region provided therearound as a non-display region. The counter substrate 10B may be disposed, for example, at a position facing the mounting substrate 10A with a predetermined gap in between. It is to be noted that the counter substrate 10B may be in contact with a top surface of the mounting substrate 10A. The counter substrate 10B may have, for example, a light-transmissive substrate that allows visible light to pass therethrough, such as a glass substrate, a transparent resin substrate, and a transparent resin film.

(Mounting Substrate 10A)

FIG. 2 illustrates an example of a perspective configuration of the mounting substrate 10A. For example, the mounting substrate 10A may be configured of a plurality of unit substrates 10C that are tiled as illustrated in FIG. 2. FIG. 3 illustrates an example of a perspective configuration of the unit substrate 10C. The unit substrate 12C may include, for example, a plurality of cells 10E that are tiled, and a supporting substrate 10D that supports each of the cells 10E. The unit substrates 10C each further include a control substrate (not illustrated). The control substrate may be, for example, electrically coupled to each of the cells 10E through each of electrode pads 34 to be described later. The supporting substrate 10D may be configured of, for example, but not limited to, a metal frame or a wiring substrate. In a case in which the supporting substrate 10D is configured of a wiring substrate, it is possible for the supporting substrate 10D to serve also as a control substrate. At this time, one of the supporting substrate 10D and the control substrate, or both are electrically coupled to each of the cells 10E (or a wiring substrate 30 to be described later) through each of the electrode pads 34. The supporting substrate 10D corresponds to a specific example of a "supporting substrate" of the present technology. The electrode pads 34 correspond to a specific example of "electrode pads" of the present technology.

(Circuit Configuration of Cell 10E)

FIG. 4 illustrates an example of a circuit configuration of the cell 10E. The cell 10E includes, in a region facing the above-described display region, a plurality of data lines Sig extending in a predetermined direction (specifically, a column direction), and a plurality of gate lines Gate extending in a predetermined direction (specifically, a row direction). The data lines Sig and the gate lines Gate may be made of, for example, copper. The data lines Sig or the gate lines Gate corresponds to a specific example of "first wiring lines" of the present technology. The cell 10E further includes a plurality of pixels 11 arranged in a matrix in the region facing the above-described display region. The pixels 11 each include a light-emitting element 12 and a drive IC 13 that drives the light-emitting element 12. The light-emitting element 12 corresponds to a specific example of a "light-emitting element" of the present technology. The drive IC 13 corresponds to a specific example of a "drive circuit" of the present technology.

The cell 10E may further include, for example, a plurality of sawtooth voltage lines Saw, a plurality of power source lines VDD1 and VDD2, a plurality of reference voltage lines Ref1 and Ref2, and a plurality of ground lines GND, in the region facing the above-described display region. The sawtooth voltage lines Saw may each extend, for example, in a predetermined direction (specifically, the row direction). The power source lines VDD1, the power source lines VDD2, the reference voltage lines Ref1, the reference voltage lines Ref2, and the ground lines GND may each extend, for example, in a predetermined direction (specifically, the column direction). It is possible to omit one or more of the sawtooth voltage lines Saw, the power source lines VDD1 and VDD2, the reference voltage lines Ref1 and Ref2, and the ground lines GND, depending on a driving mode. The sawtooth voltage lines Saw, the power source lines VDD1 and VDD2, the reference voltage lines Ref1 and Ref2, and the ground lines GND may be made of, for example, copper. It is to be noted that, in the following, the data lines Sig, the power source lines VDD1, the power source lines VDD2, the reference voltage lines Ref1, the reference voltage lines Ref2, and the ground lines GND are collectively referred to as column wiring lines. Further, in the following, the gate lines Gate and the sawtooth voltage lines Saw are collectively referred to as row wiring lines.

Each of the data lines Sig is a wiring line to which a signal corresponding to an image signal is to be inputted by the control circuit 20. The signal corresponding to the image signal may be, for example, a signal for control of light emission luminance of the light-emitting element 12. The plurality of data lines Sig may be configured of, for example, wiring lines of a number of kinds corresponding to the number of emission colors of the light-emitting element 12. When the light-emitting element 12 has three emission colors, the plurality of data lines Sig may include, for example, a plurality of data lines SigR, a plurality of data lines SigG, and a plurality of data lines SigB. Each of the data lines SigR is a wiring line to which a signal corresponding to a red image signal is to be inputted by the control circuit 20. Each of the data lines SigG is a wiring line to which a signal corresponding to a green image signal is to be inputted by the control circuit 20. Each of the data lines SigB is a wiring line to which a signal corresponding to a blue image signal is to be inputted by the control circuit 20.

The emission colors of the light-emitting element 12 may be four or more colors, without being limited to three colors. When the plurality of data lines Sig includes the plurality of data lines SigR, the plurality of data lines SigG, and the plurality of data lines SigB, one set of the data lines Sig configured of one data line SigR, one data line SigG, and one data line SigR may be, for example, assigned to each pixel column. Depending on the driving mode, the above-described one set of the data lines Sig is assigned to every plurality of pixel columns. Further, depending on the driving mode, it is possible to replace the above-described one set of the data lines Sig with the single data line Sig.

Each of the gate lines Gate is a wiring line to which a signal for selection of the light-emitting element 12 is to be inputted by the control circuit 20. The signal for selection of the light-emitting element 12 may be, for example, a signal to start sampling the signal inputted to the data line Sig, and to allow the sampled signal to be inputted to the light-emitting element 12, thereby starting light emission of the light-emitting element 12. One of the gate lines Gate may be assigned, for example, to each pixel row. Each of the sawtooth voltage lines Saw may be, for example, a wiring line to which a signal having a sawtooth waveform is to be inputted by the control circuit 20. The signal having a sawtooth waveform is compared with a sampled signal, and, for example, the sampled signal may be inputted to the light-emitting element 12, for only a period in which a peak value of the signal having a sawtooth waveform is higher than a peak value of the sampled signal. One of the sawtooth voltage lines Saw may be assigned, for example, to every two pixel rows. Each of the power source lines VDD2 is a wiring line to which a drive current to be supplied to the light-emitting element 12 is to be inputted by the control circuit 20. One of the power source lines VDD2 may be assigned, for example, to every two pixel columns. Each of the power source lines VDD1, the reference voltage lines Ref1, the reference voltage lines Ref2, and the ground lines GND is a wiring line to which a fixed voltage is to be inputted by the control circuit 20. A ground potential is inputted to each of the ground lines GND. One of the power source lines VDD1 may be assigned, for example, to every two pixel columns. One of the reference voltage lines Ref1 may be assigned, for example, to every two pixel columns. One of the reference voltage lines Ref2 may be assigned, for example, to every two pixel columns. One of the ground lines GND may be assigned, for example, to every two pixel columns.

FIG. 5 illustrates an example of a planar configuration of the light-emitting element 12. A symbol in a square in FIG. 5 indicates that a terminal adjacent to this symbol is electrically coupled to a terminal adjacent to a symbol identical thereto in FIG. 6 to be described later. The light-emitting element 12 is a chip-like component that emits light of a plurality of colors. When the emission colors of the light-emitting element 12 are three colors, the light-emitting element 12 may include, for example, a light-emitting element 12R that emits red light, a light-emitting element 12G that emits green light, and a light-emitting element 12B that emits blue light. The light-emitting elements 12R, 12G, and 12B may be covered with, for example, a protector 12i made of a resin or any other material.

Each of the light-emitting elements 12R, 12G, and 12B may be, for example, an LED chip. Here, the above-described LED chip has a micrometer-order chip size, and may have several tens of µm square, for example. The LED chip may include, for example, a semiconductor layer and two electrodes disposed on a common surface (same surface) where the semiconductor layer is disposed. The semiconductor layer may have a stacked configuration in which an active layer is interposed between semiconductor layers of different conductive types. The light-emitting elements 12R, 12G, and 12B may be chips separate from each other, or may form a common single chip.

The light-emitting element 12 may include, for example, six electrode pads 12a to 12f. In the light-emitting element 12G, one electrode is electrically coupled to an electrode pad 13m of the drive IC 13 through the electrode pad 12a and a wiring line 16 (see FIG. 4), and the other electrode is electrically coupled to the ground line GND through the electrode pad 12b and the wiring line 16. In the light-emitting element 12R, one electrode is electrically coupled to an electrode pad 13o of the drive IC 13 through the electrode pad 12c and the wiring line 16, and the other electrode is electrically coupled to the ground line GND through the electrode pad 12d and the wiring line 16. In the light-emitting element 12B, one electrode is electrically coupled to an electrode pad 13p of the drive IC 13 through the electrode pad 12e and the wiring line 16, and the other electrode is electrically coupled to the ground line GND through the electrode pad 12f and the wiring line 16.

The wiring line 16 may be, for example, a wiring line that electrically couples the pixel 11 to one of the data line Sig, the gate line Gate, the power source line VDD1, the power source line VDD2, the reference voltage line Ref1, the reference voltage line Ref2, the sawtooth voltage line Saw, and the ground line GND. The wiring line 16 may also be, for example, a wiring line that electrically couples the drive IC 13 and the light-emitting element 12 to each other, in the pixel 11. The wiring line 16 may be formed by, for example, sputtering or plating. Of a plurality of wiring lines 16, some wiring lines 16 each directly couple the pixel 11 to any of the above-described various row wiring lines and the above-described various column wiring lines. Each of the other wiring lines 16 of the plurality of wiring lines 16 is made up of a plurality of partial wiring lines that are discretely formed. In each of the wiring lines 16 made up of the plurality of partial wiring lines, partial electrodes may be coupled through one or a plurality of relay wiring lines 15 that are formed on a top surface (for example, a wiring layer 32E to be described later) of the wiring substrate 30 to be described later. The relay wiring lines 15 may be made of, for example, copper.

FIG. 6 illustrates an example of a planar configuration of the drive IC 13. A wiring line name in a square in FIG. 6 represents the name of a wiring line electrically coupled to a terminal adjacent to this wiring line name. The drive IC 13 controls the light emission of the light-emitting element 12. The drive IC 13 may include, for example, fourteen electrode pads 13a, 13b, 13c, 13d, 13e, 13f, 13g, 13h, 13i, 13k, 13m, 13n, 13o, and 13p.

The electrode pads 13a, 13b, and 13c are electrically coupled to the data lines SigG, SigR, and SigB through the wiring lines 16. The electrode pads 13d and 13e are electrically coupled to the power source lines VDD1 and VDD2 through the wiring lines 16. The electrode pads 13f and 13g are electrically coupled to the reference potential lines Ref1 and Ref2 through the wiring lines 16. The electrode pad 13h is electrically coupled to the ground line GND through the wiring line 16. The electrode pad 13i is electrically coupled to the gate line Gate through the wiring line 16. The electrode pad 13k is electrically coupled to the sawtooth voltage line Saw through the wiring line 16. The electrode pads 13m, 13o, and 13n are electrically coupled to the electrode pads 12a, 12c, and 12e of the light-emitting element 12 through the wiring lines 16. The electrode pad 13p is not connected to the wiring line 16.

(Configuration of Cell 10E)

FIG. 7 illustrates an example of a cross-sectional configuration of the cell 10E. FIG. 7 illustrates an example of a cross-sectional configuration of a portion of the cell 10E. In the portion, the light-emitting element 12, the drive IC 13, a data line SigB1, and a gate line Gate2 are formed. FIG. 8 illustrates an example of a wiring layout of the cell 10E. FIG. 8 illustrates an example of a wiring layout of the wiring lines 16 and other wiring lines coupled to the four pixels 11 corresponding to a 2-by-2 array. The wiring layout of each of the cells 10E may be, for example, a layout in which the layouts illustrated in FIG. 8 are repeatedly arranged in the row direction and the column direction. A wiring name in a square in FIG. 8 represents the name of a wiring line electrically coupled to a via 14 (to be described later) adjacent to this wiring name.

The cell 10E includes the wiring substrate 30, a fine L/S layer 40 formed in contact with a top surface of the wiring substrate 30, and the plurality of pixels 11 arranged in a matrix on a top surface of the fine L/S layer 40. The wiring substrate 30 has a role as an intermediate substrate in relation to a wiring substrate 10D. The wiring substrate 30 corresponds to a specific example of a "wiring substrate" of the present technology. The fine L/S layer 40 corresponds to a specific example of a "fine L/S layer" of the present technology. The pixels 11 correspond to a specific example of "elements" of the present technology.

The cell 10E may further include, for example, an embedding layer 44, a light-shielding layer 45, and an insulating layer 50. A surface including the pixels 11 is covered with the embedding layer 44. The light-shielding layer 45 is formed in contact with the embedding layer 44. The insulating layer 50 is formed in contact with a rear surface of the wiring substrate 30. The embedding layer 44 is made of a light-transmissive material that allows visible light to pass therethrough. The light-shielding layer 45 includes a visible-light absorbing material. The insulating layer 50 may be made of, for example, an ultraviolet curable resin or a thermosetting resin.

The light-shielding layer 45 has an opening 45A at a position facing each of the light-emitting elements 12. Light emitted from each of the light-emitting elements 12 is outputted to outside through each of the openings 45A. The insulating layer 50 has an opening 50A at a position facing each of the electrode pads 34 serving as an external connection terminal of the cell 10E. Accordingly, each of the electrode pads 34 is exposed on a rear surface of the cell 10E (the wiring substrate 30) through the opening 50A. The electrode pad 34 and the wiring substrate 10D may be electrically coupled to each other through, for example, a metal bump or solder bump provided in the opening 50A.

(Wiring Substrate 30)

The wiring substrate 30 may be, for example, a multilayer substrate in which interlayer electrical coupling is made by a via. The wiring substrate 30 includes, on the rear surface of the wiring substrate 30, the plurality of electrode pads 34 each serving as the external connection terminal. For example, one or more of the plurality of electrode pads 34 may be provided for each of a data line SigR1, a data line SigG1, the data line SigB1, a gate line Gate1, the gate line Gate2, the power source line VDD1, the reference voltage line Ref1, the reference voltage line Ref2, and the sawtooth voltage line Saw.

The wiring substrate 30 electrically couples the plurality of wiring lines 16 routed in the fine L/S layer 40 to the plurality of electrode pads 34. The wiring substrate 30 includes a plurality of through wiring lines 17 that electrically couple the plurality of wiring lines 16 to the plurality of electrode pads 34. Each of the through wiring lines 17 is a wiring line that penetrates the wiring substrate 30 in a thickness direction. Some of the through wiring lines 17 each include the data line Sig extending in the column direction in a given layer, and a plurality of vias 14 formed on (or above) the data line Sig and exposed on the top surface of the wiring substrate 30. Some of the through wiring lines 17 each include the gate line Gate extending in the row direction in a given layer, and a plurality of vias 14 formed on (or above) the gate line Gate and exposed on the top surface of the wiring substrate 30.

Some of the through wiring lines 17 each include the power source line VDD1 extending in the column direction in a given layer, and a plurality of vias 14 formed on (or above) the power source line VDD1 and exposed on the top surface of the wiring substrate 30. Some of the through wiring lines 17 each include the reference voltage line Ref1 extending in the column direction in a given layer, and a plurality of vias 14 formed on (or above) the reference voltage line Ref1 and exposed on the top surface of the wiring substrate 30. Some of the through wiring lines 17 each include the reference voltage line Ref2 extending in the column direction in a given layer, and a plurality of vias 14 formed on (or above) the reference voltage line Ref2 and exposed on the top surface of the wiring substrate 30. Some of the through wiring lines 17 each include the sawtooth voltage line Saw extending in the column direction in a given layer, and a plurality of vias 14 formed on (or above) the sawtooth voltage line Saw and exposed on the top surface of the wiring substrate 30.

In other words, in the wiring substrate 30, two or more of the plurality of vias 14 are provided for each of the data line SigR1, the data line SigG1, the data line SigB1, the gate line Gate1, the gate line Gate2, the power source line VDD1, the reference voltage line Ref1, the reference voltage line Ref2, and the sawtooth voltage line Saw.

The via 14 may be provided in an opening of an insulating layer (for example, an insulating layer 32D to be described later). The via 14 may be a columnar wiring line that electrically couples a wiring line (for example, the wiring line 16) on a top surface of the insulating layer (for example, the insulating layer 32D to be described later) to a wiring line (for example, the data line Sig or the gate line Gate) on a rear surface of the insulating layer (for example, the insulating layer 32D to be described later). The via 14 may be, for example, a conformal via or a filled via.

The plurality of vias 14 are arranged at a period corresponding to an integral multiple of an arrangement period of the plurality of pixels 11. Specifically, the plurality of vias 14 formed on (or above) the data line Sig are arranged at a period corresponding to an integral multiple of an arrangement period of the plurality of pixels 11 in the extending direction (the column direction) of the data line Sig. Similarly, the plurality of vias 14 formed on (or above) the gate line Gate are arranged at a period corresponding to an integral multiple of an arrangement period of the plurality of pixels 11 in the extending direction (the column direction) of the gate line Gate. The plurality of vias 14 formed on (or above) the power source line VDD1 are arranged at a period corresponding to an integral multiple of an arrangement period of the plurality of pixels 11 in the extending direction (the column direction) of the power source line VDD1. The plurality of vias 14 formed on (or above) the reference voltage line Ref1 are arranged at a period corresponding to an integral multiple of an arrangement period of the plurality of pixels 11 in the extending direction (the column direction) of the reference voltage line Ref1. The plurality of vias 14 formed on (or above) the reference voltage line Ref2 are arranged at a period corresponding to an integral multiple of an arrangement period of the plurality of pixels 11 in the extending direction (the column direction) of the reference voltage line Ref2. The plurality of vias 14 formed on (or above) the sawtooth voltage line Saw are arranged at a period corresponding to an integral multiple of an arrangement period of the plurality of pixels 11 in the extending direction (the column direction) of the sawtooth voltage line Saw.

Two or more adjacent ones of the pixels 11 are electrically coupled to one common via 14 through one or more of the wiring lines 16. Specifically, two or more of the pixels 11 aligned in the extending direction (the column direction) of the data line Sig are electrically coupled to one common via formed on (or above) the data line Sig through one or more of the wiring lines 16. Similarly, two or more of the pixels 11 aligned in the extending direction (the row direction) of the gate line Gate are electrically coupled to one common via formed on (or above) the gate line Gate, through one or more of the wiring lines 16. Two or more of the pixels 11 aligned in the extending direction (the column direction) of the power source line VDD1 are electrically coupled to one common via formed on (or above) the power source line VDD1 through one or more of the wiring lines 16. Two or more of the pixels 11 aligned in the extending direction (the column direction) of the reference voltage line Ref1 are electrically coupled to one common via formed on (or above) the reference voltage line Ref1 through one or more of the wiring lines 16. Two or more of the pixels 11 aligned in the extending direction (the column direction) of the reference voltage line Ref2 are electrically coupled to one common via formed on (or above) the reference voltage line Ref2, through one or a plurality of wiring lines 16. Two or more of the pixels 11 aligned in the extending direction (the row direction) of the sawtooth voltage line Saw are electrically coupled to one common via formed on (or above) the sawtooth voltage line Saw through one or more of the wiring lines 16.

In FIG. 8, the via 14 is shared by the two pixels 11 aligned in the row direction, the two pixels 11 aligned in the column direction, and the four pixels 11 corresponding to the 2-by-2 array. For example, the two pixels 11 aligned in the column direction may be electrically coupled, through one or more of the wiring lines 16, to one common via 14 electrically coupled to the data line SigB1. At this time, two or more of the vias 14 electrically coupled to the data line SigB1 are arranged at twice the arrangement period in the column direction of the plurality of pixels 11. For example, the two pixels 11 aligned in the row direction may be electrically coupled, through one or more of the wiring lines 16, to one common via 14 electrically coupled to the gate line Gate1. At this time, two or more of the vias 14 electrically coupled to the gate line Gate1 are arranged at twice the arrangement period in the row direction of the plurality of pixels 11. For example, the four pixels 11 corresponding to 2 by 2 may be electrically coupled, through one or more of the wiring lines 16, to one common via 14 electrically coupled to the reference voltage line Ref1. At this time, two or more of the vias 14 electrically coupled to the reference voltage line Ref1 are arranged at twice the arrangement period in the column direction of the plurality of pixels 11.

When the wiring layout (the wiring layout of an example) illustrated in FIG. 8 is compared with a wiring layout in the following comparative example, the number of the vias 14 necessary in the four pixels 11 corresponding to 2 by 2 is as follows. It is to be noted that, in the comparative example, one via 14 is provided for each of a data line SigR1, a data line SigG1, a data line SigB1, a gate line Gate1, a gate line Gate2, a power source line VDD1, a reference voltage line Ref1, a reference voltage line Ref2, and a sawtooth voltage line Saw, in each pixel 11.

|  | Example | Comparative Example |
| --- | --- | --- |
| SigR1 | 2 | 2 |
| SigG1 | 1 | 2 |
| SigB1 | 1 | 2 |
| SigR2 | 1 | 2 |
| SigG2 | 1 | 2 |
| SigB2 | 1 | 2 |
| VDD1 | 1 | 4 |
| Ref1 | 1 | 4 |
| Ref2 | 1 | 4 |
| Gate1 | 1 | 2 |
| Gate2 | 1 | 2 |
| Saw | 2 | 4 |
| Total | 14 | 32 |

As can be seen from the above, sharing the via 14 by two or more adjacent ones of the pixels 11 decreases the number of the vias 14 necessary for each of the pixels 11, as compared with a case in which the via 14 is provided for each of the pixels 11.

Incidentally, as described above, the wiring layout of each of the cells 10E may be, for example, a layout in which the layouts illustrated in FIG. 8 are repeatedly arranged in the row direction and the column direction. At this time, a pitch of the pixels 11 may be preferably equal not only in each of the cells 10E but also in two adjacent cells 10E. In each of the cells 10E, a plurality of electrode pads 34 are provided as external connection terminals of each of the cells 10E on the rear surface of the cell 10E. This makes it possible to omit or minimize a frame region that is not usable for arrangement of the pixels 11, for example, in a case in which an external connection terminal is provided on an outer edge of a top surface of a mounting surface. Accordingly, in a case in which such a frame region is omitted from each of the cells 10E, or in a case in which such a frame region is minimized in each of the cells 10E, it is possible for the pitch of the pixels 11 to be equal even in two adjacent cells 10E.

The wiring substrate 30 may be, for example, a build-up substrate including a core substrate 31, a build-up layer 32, and a build-up layer 33. The build-up layer 32 is formed in contact with a top surface of the core substrate 31. The build-up layer 33 is formed in contact with a rear surface of the core substrate 31. The wiring substrate 30 corresponds to a specific example of a "build-up substrate" of the present technology. The build-up layers 32 and 33 correspond to specific examples of a "build-up layer" of the present technology.

The core substrate 31 ensures rigidity of the cell 10E, and may be, for example, a glass epoxy substrate. The build-up layer 32 includes one or more wiring layers. The build-up layer 32 may include, for example, a wiring layer 32A, an insulating layer 32B, a wiring layer 32C, the insulating layer 32D, and the wiring layer 32E in this order from the top surface of the core substrate 31, as illustrated in FIG. 7. The build-up layer 33 includes one or more wiring layers. The build-up layer 33 may include, for example, a wiring layer 33A, an insulating layer 33B, a wiring layer 33C, an insulating layer 33D, and a wiring layer 33E in this order from the rear surface of the core substrate 31, as illustrated in FIG. 7. The wiring layers 32A, 32C, 32E, 33A, 33C, and 33E may be made of, for example, copper. The insulating layers 32B, 32D, 33B, and 33D may be made of, for example, an ultraviolet curable resin or a thermosetting resin.

Each of the data lines Sig may be formed, for example, in the wiring layer 32C. FIG. 7 illustrates, by way of example, a state where the data line SigB1 is formed in the wiring layer 32C. Each of the gate lines Gate is formed in a layer different from that of the data line Sig, and may be formed, for example, in the wiring layer 32A. FIG. 7 illustrates, by way of example, a state where the gate line Gate2 is formed in the wiring layer 32A. Each of the power source lines VDD2 and the ground lines GND may be formed, for example, in the wiring layer 32E. Each of the vias 14 is formed at least in the build-up layer 32, and may be formed, for example, at least in the same layer as the insulating layer 32D. FIG. 7 illustrates, by way of example, a state where each of the vias 14 is formed in the same layer as the insulating layer 32D and the wiring layer 32E. Each of the electrode pads 34 is formed in the build-up layer 33, and may each be formed, for example, in the same layer as the wiring layer 33E. The relay wiring line 15 to be described later is formed in the wiring layer 32E, which is a wiring layer forming the top surface of the wiring substrate 30.

(Fine L/S Layer 40)

The fine L/S layer 40 includes a wiring layer 42, and an insulating layer 41 provided between the wiring layer 42 and the top surface of the wiring substrate 30. The insulating layer 41 is in contact with the wiring layer 42 and the top surface of the wiring substrate 30. The wiring layer 42 is a layer including each of the wiring lines 16. Therefore, the insulating layer 41 is provided between each of the wiring lines 16 and the top surface of the wiring substrate 30, and is in contact with each of the wiring lines 16 and the top surface of the wiring substrate 30. The insulating layer 41 has an opening 41A at a position facing the top surface of each of the vias 14. The insulating layer 41 may have the opening 41A at a position facing the relay wiring line 15 electrically coupled to the via 14, not at the position facing the vias 14. The insulating layer 41 further has the opening 41A at a position facing the relay wiring line 15 electrically coupled to the above-described partial electrode. A portion of the via 14 or a portion of the relay wiring line 15 is exposed on a bottom surface of the opening 41A. The insulating layer 41 may be made of, for example, VPA. VPA is generally used as a resist. For example, VPA manufactured from Nippon Steel Chemical Co., Ltd. has been introduced on the market. In a case in which the insulating layer 41 is made of VPA, for example, selective light-exposure and development of VPA may make it possible to form the opening 41 in the VPA.

In the wiring layer 42, of the wiring lines 16, one or more of some wiring lines 16 are provided for each of the vias 14, while one or more of some other wiring lines 16 are provided for each of the intermediate wiring lines 15, and two or more of the remaining wiring lines 16 are provided for each of the power source line VDD2 and the ground line GND. The wiring layer 42 (each of the wiring lines 16) may include, for example, a seed layer 42A and a plating layer 42B. The seed layer 42A is in contact with the top surface of the wiring substrate 30 including the bottom surfaces and side surfaces of the openings 41A. The plating layer 42B is in contact with a top surface of the seed layer 42A. The seed layer 42A serves as a plating growth surface when the plating layer 42B is formed in a manufacturing process. The seed layer 42A is in contact with the bottom surface of the opening 41A, and is electrically coupled to the via 14 and the relay wiring line 15. The seed layer 42A may be made of, for example, copper. The plating layer 42B is formed by a plating process using the seed layer 42A as the plating growth surface in the manufacturing process. Note that, for example, the wiring layer 42 (each of the wiring lines 16) may be a layer formed by sputtering.

As described above, the wiring layer 42 (each of the wiring lines 16) is formed in contact with a top surface of the insulating layer 41. In contrast, electrodes of the pixels 11 are formed in contact with the top surface of the seed layer 42A. Therefore, the light-emitting elements 12 and the drive ICs 13 are formed on the same surface (the top surface of the seed layer 42A). To be exact, the light-emitting elements 12 and the drive ICs 13 are formed on a surface different from a surface (the top surface of the insulating layer 41) where the wiring layer 42 (each of the wiring lines 16) is formed. However, in terms of mounting of the pixels 11, a surface including the top surface of the insulating layer 41 and the top surface of the seed layer 42A serves as a mounting surface 41S. Accordingly, the wiring layer 42 (each of the wiring lines 16) is formed on the mounting surface 41S for the pixels 11, and is formed in a surface substantially common to the pixels 11.

The wiring layer 42 (each of the wiring lines 16) may be bonded by plating to, for example, the via 14, a member (for example, the relay wiring line 15) electrically coupled to the via 14, and the relay wiring line 15 electrically coupled to the above-described partial electrode. When the wiring layer 42 (each of the wiring lines 16) is formed by plating, bonding between the wiring layer 42 (each of the wiring lines 16), and the via 14 and other components may be performed together in a process of forming the wiring layer 42 (each of the wiring lines 16). The wiring layer 42 (each of the wiring lines 16) may be bonded to, for example, the pixels 11 (the light-emitting elements 12 and the drive ICs 13) by plating. When the wiring layer 42 (each of the wiring lines 16) is formed by plating, bonding between the wiring layer 42 (each of the wiring lines 16) and the pixels 11 may be performed together in the process of forming the wiring layer 42 (each of the wiring lines 16).

An L/S (line and space) of the fine L/S layer 40 is smaller than an L/S of the wiring substrate 30. The L/S indicates the narrowest wiring pitch in a plane. The L/S of the fine L/S layer 40 is smaller than those of the plurality of signal lines Sig, the plurality of gate lines Gate, the plurality of voltage lines VDD1, the plurality of reference voltage lines Ref1, the plurality of reference voltage lines Ref2, and the sawtooth voltage line Saw. The L/S of the fine L/S layer 40 may be, for example, about 25 μm. In contrast, the L/S of the wiring substrate 30 may be, for example, about 75 μm.

[Manufacturing Method]

Next, an example of a method of manufacturing the cell 10E will be described with reference to FIG. 9 to FIG. 13. FIG. 9 to FIG. 13 illustrate an example of a procedure of manufacturing the cell 10E in order of processes.

First, the wiring substrate 30 is prepared. Next, the insulating layer 41 is formed on the top surface of the wiring substrate 30, and then the opening 41A is formed in the insulating layer 41, at the position facing the top surface of the via 14, by a be predetermined method (FIG. 9). At this time, although not illustrated, the opening 41A is also formed, by a predetermined method, at the position facing the top surface of the relay wiring line 15 electrically coupled to the via 14 and the above-described partial wiring lines. Next, the seed layer 42A is formed on the top surface of the wiring substrate 30 including the bottom surfaces and the side surfaces of the openings 41A (FIG. 10).

Next, a fixing layer 43A that temporarily fixes the light-emitting elements 12 and the drive ICs 13 is formed by a process such as coating an entire surface with an insulating glue (see FIG. 11). A layer of an adhesive as typified by a silicone-based adhesive and an acrylic adhesive may be formed as the fixing layer 43A instead of the glue. Subsequently, the light-emitting elements 12 and the drive ICs 13 are temporarily fixed by the fixing layer 43A (FIG. 11). At this time, the electrode pads 12a to 12e of the light-emitting element 12 and the electrode pads 13a to 13p of the drive IC 13 are disposed close enough to be connectable to a metal body (the plating layer 42B) that is to be grown in a plating process to be described later.

Next, the fixing layer 43A except for portions temporarily fixing the light-emitting elements 12 and the drive ICs 13 (portions present on the bottom surfaces of the light-emitting elements 12 and the drive ICs 13, of the fixing layer 43A) is removed. As a result, the fixing layer 43A remains only on the bottom surfaces of the light-emitting elements 12 and the drive ICs 13 (FIG. 12). In FIG. 12, the remaining fixing layer 43A is illustrated as a fixing layer 43. In removing the fixing layer 43A, it may be possible to perform, for example, dry etching or organic solvent immersion. It is to be noted that the insulating glue may be applied beforehand only to positions where the light-emitting elements 12 and the drive ICs 13 are to be temporarily fixed.

Thereafter, the plating process is performed with use of the seed layer 42A as the plating growth surface to form the plating layer 42B on the top surface of the seed layer 42A (FIG. 13). Thus, the wiring layer 42 (each of the wiring lines 16) is formed. At this time, bonding between the wiring layer 42 (each of the wiring lines 16), and the vias 14 and other components is performed together in the process of forming the wiring layer 42 (each of the wiring lines 16). In addition, bonding between the wiring layer 42 (each of the wiring lines 16) and the pixels 11 is performed together in the process of forming the wiring layer 42 (each of the wiring lines 16). Afterwards, the light-emitting elements 12 and the drive ICs 13 are embedded in the embedding layer 43, and thereafter, the light-shielding layer 45 is formed (see FIG. 7). Thus, the cell 10E is manufactured.

[Workings and Effects]

Next, workings and effects of the display unit 1 will be described. In the present embodiment, two or more of the vias 14 is provided for each wiring line (for example, the data lines Sig and the gate lines Gate) that extends in a predetermined direction in a layer, in the wiring substrate 30. The two or more of the vias 14 provided for each wiring line that extends in the predetermined direction in the layer is arranged at a period corresponding to an integral multiple of an arrangement period of the plurality of pixels 11. Further, two or more adjacent ones of the pixels 11 on the fine L/S layer 40 are electrically coupled to the common via 14 through one or more of the wiring lines 16 in the fine L/S layer 40. Sharing the via 14 by two or more adjacent ones of the pixels 11 decreases the number of the vias 14 necessary for each of the pixels 11, as compared with a case in which the via 14 is provided for each of the pixels 11. As a result, the number of the wiring layers 42 on the wiring substrate 30 is allowed to be one, when the L/S of the fine L/S layer 40 on the wiring substrate 30 is smaller than the L/S of the plurality of wiring lines (for example, the plurality of data lines Sig or the plurality of gate lines Gate) in the wiring substrate 30. Therefore, in the present embodiment, it is possible to reduce the wiring pitch of the mounting surface 41S, without making the wiring layer 42 on the wiring substrate 30 multilayered.

2. Modification Examples

First Modification Example

In the above-described embodiment, for example, the light-emitting element 12 and the drive IC 13 may be integrally formed as illustrated in FIG. 14 to configure the pixel 11.

Second Modification Example

In the above-described embodiment and the modification example thereof, the emission color of the light-emitting element 12 may be a single color. In this case, for example, the cell 10E may include a color filter for a plurality of colors in the opening 45A. Further, in the above-described second modification, the emission color of the light-emitting element 12 may be a single color. In this case, for example, the counter substrate 10B may include a color filter for a plurality of colors in the opening 45A.

3. Second Embodiment

FIG. 15 illustrates an example of a perspective configuration of an illumination unit 2 according to a second embodiment of the present technology. The illumination unit 2 corresponds to the display unit 1 according to any of the above-described first embodiment and the modification examples thereof (the first and second modification examples), except that a signal to be inputted to the data line Sig does not change momently like the image signal, but has a fixed value corresponding to brightness of illumination light. The illumination unit 2 may include, for example, an illumination panel 60 and a control circuit 70 that controls the illumination panel 60 as illustrated in FIG. 15.

The illumination panel 60 is a panel configured by stacking a mounting substrate 60A and a counter substrate 60B. A surface of the counter substrate 60B serves as a light emission surface. The counter substrate 60B is disposed at a position facing the mounting substrate 60A with a predetermined gap in between. The counter substrate 60B may have, for example, a light-transmissive substrate that allows visible light to pass therethrough, such as a glass substrate and a transparent resin substrate.

The mounting substrate 60A may be configured of, for example, a plurality of unit substrates that are tiled as illustrated in FIG. 2. Each of the unit substrates may include, for example, a plurality of cells that are tiled and a wiring substrate that supports each of the cells. In each of the cells, wiring lines that are unnecessary for driving of the pixels 11 in a case in which a signal to be inputted to the data line Sig has a fixed value may be omitted as appropriate in FIGS. 4, 7, 8, and 14, for example.

[Workings and Effects]

Next, workings and effects of the illumination unit 2 will be described. In the present embodiment, as with the display unit 1 according to the above-described first embodiment and modification examples thereof, two or more of the vias 14 are provided for each wiring line that extends in a predetermined direction in a layer, in a wiring substrate 30. The two or more of the vias 14 provided for each wiring lien that extends in the predetermined direction in the layer is arranged at a period corresponding to an integral multiple of the arrangement period of the plurality of pixels 11. Further, two or more adjacent ones of light-receiving elements on the fine L/S layer 40 are electrically coupled to the common via 14 through one or more of the wiring lines 16 in the fine L/S layer 40. Sharing the via 14 by the two or more adjacent ones of the pixels 11 decreases the number of the vias 14 necessary for each of the pixels 11, as compared with a case in which the via 14 is provided for each of the pixels 11. As a result, the number of wiring layers 42 on the wiring substrate 30 is allowed to be one, when the L/S of the fine L/S layer 40 on the wiring substrate 30 is smaller than the L/S of the plurality of wiring lines in the wiring substrate 30. Therefore, in the present embodiment, it is possible to reduce the wiring pitch of the mounting surface 41S, without making the wiring layer 42 on the wiring substrate 30 multilayered.

4. Third Embodiment

FIG. 16 illustrates an example of a perspective configuration of a light receiver 3 according to a third embodiment of the present technology. The light receiver 3 corresponds to the display unit 1 according to the foregoing first embodiment, except that light-receiving elements are provided in place of the pixels 11. The light receiver 2 may include, for example, a light-receiving panel 80 and a control circuit 90 that controls the light-receiving panel 80, as illustrated in FIG. 16.

The light-receiving panel 80 is a panel configured by stacking a mounting substrate 80A and a counter substrate 80B. A surface of the counter substrate 80B serves as a light-receiving surface. The counter substrate 80B is disposed at a position facing the mounting substrate 80A with a predetermined gap in between. The counter substrate 80B may have, for example, a light-transmissive substrate that allows visible light to pass therethrough, such as a glass substrate and a transparent resin substrate.

The mounting substrate 80A may be configured of, for example, a plurality of unit substrates that are tiled as illustrated in FIG. 2. Each of the unit substrates may include, for example, a plurality of cells that are tiled and a wiring substrate that supports each of the cells. Each of the cells may correspond to, for example, the cell in FIG. 4, FIG. 7, and FIG. 14, except that a light-receiving element is provided in place of the pixel 11. However, a wiring unnecessary for driving of the light-receiving element is omitted as appropriate.

[Workings and Effects]

Next, workings and effects of the light receiver 3 will be described. In the present embodiment, as with the display unit 1 according to the above-described first embodiment and the modification examples thereof, two or more of the vias 14 are provided for each wiring line that extends in a predetermined direction in a layer, in a wiring substrate 30. The two or more of the vias 14 provided for each wiring line that extends in the predetermined direction in the layer are arranged at a period corresponding to an integral multiple of the arrangement period of a plurality of light-receiving elements. Further, two or more adjacent ones of the light-receiving elements on the fine L/S layer 40 are electrically coupled to the common via 14, through one or more of the wiring lines 16 in the fine L/S layer 40. Sharing the via 14 by the two or more adjacent ones of the light-receiving elements decreases the number of the vias 14 necessary for each of the light-receiving elements, as compared with a case in which the via 14 is provided for each of the light-receiving elements. As a result, the number of wiring layers 42 on the wiring substrate 30 is allowed to be one, when the L/S of the fine L/S layer 40 on the wiring substrate 30 is smaller than the L/S of the plurality of wiring lines in the wiring substrate 30. Therefore, in the present embodiment, it is possible to reduce the wiring pitch of the mounting surface 41S, without making the wiring layer 42 on the wiring substrate 30 multilayered.

5. Modification Examples Common to Respective Embodiments

In the above-described embodiments and modification examples thereof, the light-shielding layer 45 may be disposed on the rear surface (the surface on side of each of the mounting substrates 10A, 60A, and 80A) of each of the counter substrates 10B, 60B, and 80B.

In the above-described embodiments and modification examples thereof, for example, the counter substrates 10B, 60B, and 80B may be omitted as illustrated in FIG. 17 to FIG. 19. Further, in the above-described embodiments and modification examples thereof, one counter substrate 10B, one counter substrate 60B, or one counter substrate 80B may be provided for each of the unit substrates 10C or each of the cells 12E.

In the above-described embodiments and modification examples thereof, the light-shielding layer 45 may be omitted.

Further, in the above-described embodiments and modification examples thereof, each of the pixels 11 (the light-emitting elements 12 and the drive ICs 13) is bonded to the wiring layer 42 (each of the wiring lines 16) by plating, but may be bonded by soldering, for example. For example, a solder bump is provided on an electrode pad of each of the light-emitting elements 12 and the drive ICs 13, and thereafter, the light-emitting elements 12 and the drive ICs 13 may be disposed on the wiring lines 16. Thereafter, reflow may be performed. This makes it possible to bond the light-emitting elements 12 and the drive ICs 13 to the wiring lines 16 by soldering.

Moreover, the present technology may have any of the following configurations.

(1) A mounting substrate, including:
a wiring substrate;
a fine L/S (line and space) layer formed in contact with a top surface of the wiring substrate; and
a plurality of elements arranged in a matrix on a top surface of the fine L/S layer,
wherein the wiring substrate includes
a plurality of first wiring lines extending in a predetermined direction in a layer, and
a plurality of vias arranged at a period corresponding to an integral multiple of an arrangement period of the plurality of element, two or more of the vias being provided for each of the first wiring lines,
the fine L/S layer includes
a plurality of second wiring lines, one or more of the second wiring lines being provided for each of the vias, and
an insulating layer provided between each of the second wiring lines and the top surface of the wiring substrate, and being in contact with each of the second wiring lines and the top surface of the wiring substrate,
an L/S of the fine L/S layer is smaller than an L/S of the plurality of first wiring lines, and
two or more adjacent ones of the elements are electrically coupled to common one of the vias through one or more of the second wiring lines.

(2) The mounting substrate according to (1), wherein
the plurality of first wiring lines extend in a row direction or a column direction,
the plurality of vias are arranged at a period corresponding to an integral multiple of an arrangement period of the plurality of elements in an extending direction of the first wiring lines, and
the plurality of elements aligned in the extending direction of the first wiring lines are electrically coupled to common one of the vias through one or more of the second wiring lines.

(3) The mounting substrate according to (1) or (2), wherein the vias are formed on or above the second wiring line, and exposed on the top surface of the wiring substrate.

(4) The mounting substrate according to any one of (1) to (3), wherein the wiring substrate includes a plurality of electrode pads exposed on a rear surface of the wiring substrate, one or more of the electrode pads being provided for each of the first wiring lines.

(5) The mounting substrate according to any one of (1) to (4), wherein the second wiring line is bonded by plating to the via or a member electrically coupled to the via, and is further bonded by plating to each of the elements.

(6) The mounting substrate according to any one of (1) to (5), wherein
the wiring substrate is a build-up substrate including a core substrate and one or more build-up layers formed on each of both sides of the core substrate,
the vias are formed at least in the build-up layer on top-surface side of the wiring substrate, and
the electrode pads are formed at least in the build-up layer on rear surface side of the wiring substrate.

(7) The mounting substrate according to any one of (1) to (6), wherein the elements each include a light-emitting element and a drive circuit that drives the light-emitting element.

(8) An electronic apparatus, including:
one or a plurality of mounting substrates; and
a control circuit that controls the one or more mounting substrates,
wherein the mounting substrate includes
a wiring substrate,
a fine L/S (line and space) layer formed in contact with a top surface of the wiring substrate, and
a plurality of elements arranged in a matrix on a top surface of the fine L/S layer,
wherein the wiring substrate includes
a plurality of first wiring lines extending in a predetermined direction in a layer, and
a plurality of vias arranged at a period corresponding to an integral multiple of an arrangement period of the plurality of element, two or more of the vias being provided for each of the first wiring lines,
the fine L/S layer includes
a plurality of second wiring lines, one or more of the second wiring lines being provided for each of the vias, and
an insulating layer provided between each of the second wiring lines and the top surface of the wiring substrate, and being in contact with each of the second wiring lines and the top surface of the wiring substrate,
an L/S of the fine L/S layer is smaller than an L/S of the plurality of first wiring lines, and
two or more adjacent ones of the elements are electrically coupled to common one of the vias through one or more of the second wiring lines.

(9) The electronic apparatus according to (8), further including:
a supporting substrate that supports the plurality of mounting substrates; and
a control substrate that controls the plurality of mounting substrates,
wherein the plurality of mounting substrates are tiled on the supporting substrate,
the wiring substrates each include a plurality of electrode pads exposed on a rear surface of the wiring substrate, one or more of the electrode pads being provided for each of the first wiring lines, and
one of the supporting substrate and the control substrate, or both are electrically coupled to each of the wiring substrates through each of the electrode pads.

The present application is based on and claims priority from Japanese Patent Application No. 2014-074844 filed in the Japan Patent Office on Mar. 31, 2014, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A mounting substrate, comprising:
a wiring substrate;
a fine line layer formed in contact with a top surface of the wiring substrate;
a plurality of elements arranged in a matrix on a top surface of the fine line layer, wherein the plurality of elements each include a light-emitting element and a drive circuit that drives the light-emitting element, and wherein the light-emitting element and the drive circuit are mounted directly on the top surface of the fine line layer;
a light-transmissive embedding layer formed over the fine line layer and the plurality of elements; and a light-shielding layer formed over the light-transmissive embedding layer, the light-shielding layer having an opening facing each light-emitting element, wherein the wiring substrate includes:
a plurality of first wiring lines extending in a predetermined direction in a layer, and
a plurality of vias arranged at a period corresponding to an integral multiple of an arrangement period of the plurality of elements, two or more of the plurality of vias being provided for each of the plurality of first wiring lines, the fine line layer includes:
a plurality of second wiring lines, one or more of the plurality of second wiring lines being provided for each of the plurality of vias, and
an insulating layer provided between each of the plurality of second wiring lines and the top surface of the wiring substrate, and being in contact with each of the plurality of second wiring lines and the top surface of the wiring substrate, a wiring pitch of the fine line layer is smaller than a wiring pitch of at least one of the plurality of first wiring lines, and two or more adjacent ones of the plurality of elements are electrically coupled to a common one of the plurality of vias through the one or more of the plurality of second wiring lines.

2. The mounting substrate according to claim 1, wherein the plurality of first wiring lines extend in a row direction or a column direction,
the plurality of vias are arranged at the period corresponding to the integral multiple of the arrangement period of the plurality of elements in an extending direction of the plurality of first wiring lines, and
the plurality of elements aligned in the extending direction of the plurality of first wiring lines are electrically coupled to the common one of the plurality of vias through the one or more of the plurality of second wiring lines.

3. The mounting substrate according to claim 2, wherein the plurality of vias are formed on or above the plurality of second wiring lines, and exposed on the top surface of the wiring substrate.

4. The mounting substrate according to claim 3, wherein the wiring substrate includes a plurality of electrode pads exposed on a rear surface of the wiring substrate, one or more of the plurality of electrode pads being provided for each of the plurality of first wiring lines.

5. The mounting substrate according to claim 4, wherein each of the plurality of second wiring lines is bonded by plating to the plurality of via or a member electrically coupled to the plurality of via, and is further bonded by plating to each of the plurality of elements.

6. The mounting substrate according to claim 5, wherein the wiring substrate is a build-up substrate including a core substrate and one or more build-up layers formed on each of both sides of the core substrate,
the plurality of vias are formed at least in the one or more build-up layers on the top surface of the wiring substrate, and
the plurality of electrode pads are formed at least in the one or more build-up layers on the rear surface of the wiring substrate.

7. An electronic apparatus, comprising:
one or a plurality of mounting substrates; and
a control circuit that controls the one or plurality of mounting substrates,
wherein the one or the plurality of mounting substrate each includes:
a wiring substrate,
a fine line layer formed in contact with a top surface of the wiring substrate,
a plurality of elements arranged in a matrix on a top surface of the fine line layer, wherein the plurality of elements each include a light-emitting element and a drive circuit that drives the light-emitting element, and wherein the light-emitting element and the drive circuit are mounted directly on the top surface of the fine line layer,
a light-transmissive embedding layer formed over the fine line layer and the plurality of elements, and
a light-shielding layer formed over the light-transmissive embedding layer, the light-shielding layer having an opening facing each light-emitting element,
wherein the wiring substrate of the one or a plurality of mounting substrates each includes:
a plurality of first wiring lines extending in a predetermined direction in a layer, and
a plurality of vias arranged at a period corresponding to an integral multiple of an arrangement period of the plurality of elements, two or more of the plurality of vias being provided for each of the plurality of first wiring lines,
the fine line layer of the one or a plurality of mounting substrates each includes:
a plurality of second wiring lines, one or more of the plurality of second wiring lines being provided for each of the plurality of vias, and
an insulating layer provided between each of the plurality of second wiring lines and the top surface of the wiring substrate, and being in contact with each of the plurality of second wiring lines and the top surface of the wiring substrate,
a wiring pitch of the fine line layer is smaller than a wiring pitch of at least one of the plurality of first wiring lines, and
two or more adjacent ones of the plurality of elements are electrically coupled to a common one of the plurality of vias through the one or more of the plurality of second wiring lines.

8. The electronic apparatus according to claim 7, further comprising:
a supporting substrate that supports the one or a plurality of mounting substrates; and
a control substrate that controls the one or a plurality of mounting substrates, wherein the one or a plurality of mounting substrates are tiled on the supporting substrate,
the wiring substrate of the one or a plurality of mounting substrates each include a plurality of electrode pads exposed on a rear surface of the wiring substrate, one or more of the plurality of electrode pads being provided for each of the plurality of first wiring lines, and
one or both of the supporting substrate and the control substrate are electrically coupled to each wiring substrate through each of the plurality of electrode pads.

* * * * *